United States Patent
Yon et al.

(10) Patent No.: US 9,389,125 B2
(45) Date of Patent: Jul. 12, 2016

(54) METHOD FOR MAKING AN INFRARED DETECTION DEVICE

(71) Applicant: COMMISSARIAT A L'ENERGIE ATOMIQUE ET AUX ENE ALT, Paris (FR)

(72) Inventors: Jean-Jacques Yon, Sassenage (FR); Geoffroy Dumont, Paris (FR); Pierre Imperinetti, Seyssins (FR); Stephane Pocas, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 230 days.

(21) Appl. No.: 14/107,106

(22) Filed: Dec. 16, 2013

(65) Prior Publication Data

US 2014/0319350 A1    Oct. 30, 2014

(30) Foreign Application Priority Data

Dec. 17, 2012 (FR) .................... 12 62153

(51) Int. Cl.
*G01J 5/20* (2006.01)
*G01J 5/10* (2006.01)
(Continued)

(52) U.S. Cl.
CPC .. *G01J 5/20* (2013.01); *G01J 5/024* (2013.01); *H01L 31/18* (2013.01); *G01J 2005/106* (2013.01)

(58) Field of Classification Search
CPC ....... G01J 5/20; G01J 5/024; G01J 2005/106; H01L 31/18

USPC ...................................... 250/338.4
See application file for complete search history.

(56) References Cited

U.S. PATENT DOCUMENTS

| 5,895,233 A | 4/1999 | Higashi et al. |
| 5,912,464 A | 6/1999 | Vilain et al. |
| 6,031,231 A * | 2/2000 | Kimata ............ G01J 5/08 250/332 |

(Continued)

FOREIGN PATENT DOCUMENTS

| DE | 10058864 A1 * | 6/2002 | ......... B81C 1/00238 |
| EP | 1 243 903 A2 | 9/2002 | |

(Continued)

OTHER PUBLICATIONS

French Preliminary Search Report issued Jun. 7, 2013 in French Application 12 62153, filed on Dec. 17, 2012 ( with English Translation of Categories of Cited Documents).

(Continued)

*Primary Examiner* — David Porta
*Assistant Examiner* — Blake Riddick
(74) *Attorney, Agent, or Firm* — Oblon, McClelland, Maier & Neustadt, L.L.P.

(57) ABSTRACT

An infrared detection device including an infrared heat detector and a connection pad each spaced apart from an etching stop layer by a non-zero distance substantially equal relatively to each other, wherein first and second electrically conducting vias are respectively electrically connected to first and second portions of a metal line of a penultimate level of electrical interconnections, and wherein an empty space formed in a first inter-metal dielectric layer surrounds the first electrically conducting via and extends under the infrared heat detector.

22 Claims, 13 Drawing Sheets

(51) Int. Cl.
  *H01L 31/18* (2006.01)
  *G01J 5/02* (2006.01)

(56) References Cited

U.S. PATENT DOCUMENTS

| | | | | |
|---|---|---|---|---|
| 6,229,144 | B1* | 5/2001 | Ouvrier-Buffet | G01J 5/20 250/338.4 |
| 6,348,650 | B1* | 2/2002 | Endo | G01J 5/12 136/201 |
| 6,388,256 | B1* | 5/2002 | Watton | G01J 5/20 250/338.1 |
| 6,465,784 | B1* | 10/2002 | Kimata | G01J 5/20 250/332 |
| 7,112,829 | B2* | 9/2006 | Picard | H01S 5/327 257/103 |
| 8,138,532 | B2* | 3/2012 | Tomomatsu | H01L 31/105 257/290 |
| 2001/0025926 | A1* | 10/2001 | Mashio | G01J 5/20 250/338.4 |
| 2001/0054315 | A1* | 12/2001 | Aigner | B81C 1/00896 73/727 |
| 2002/0039838 | A1* | 4/2002 | Iida | G01J 5/10 438/689 |
| 2002/0175284 | A1 | 11/2002 | Vilain | |
| 2003/0168599 | A1* | 9/2003 | Liddiard | G01J 5/20 250/338.1 |
| 2004/0053435 | A1* | 3/2004 | Ikushima | B81B 3/0072 438/57 |
| 2004/0061117 | A1* | 4/2004 | Picard | H01S 5/327 257/79 |
| 2005/0098840 | A1* | 5/2005 | Fuertsch | B81B 3/007 257/414 |
| 2005/0139774 | A1* | 6/2005 | Ikegawa | G01J 5/20 250/338.1 |
| 2005/0224714 | A1* | 10/2005 | Akin | G01J 5/20 250/332 |
| 2006/0208189 | A1* | 9/2006 | Vilain | G01J 5/20 250/339.04 |
| 2006/0244067 | A1* | 11/2006 | Socher | B81B 3/0062 257/350 |
| 2007/0029632 | A1* | 2/2007 | Hausner | G01J 5/02 257/434 |
| 2007/0120059 | A1* | 5/2007 | Tailhades | C01G 49/0018 250/338.3 |
| 2007/0158570 | A1* | 7/2007 | Ohta | G01J 5/02 250/338.1 |
| 2007/0164417 | A1* | 7/2007 | Todd | G01J 5/02 257/685 |
| 2008/0067499 | A1* | 3/2008 | Maa | B82Y 20/00 257/15 |
| 2008/0224171 | A1* | 9/2008 | Ballet | B82Y 20/00 257/103 |
| 2008/0237469 | A1 | 10/2008 | Oda et al. | |
| 2008/0237766 | A1* | 10/2008 | Kim | H01L 27/14627 257/432 |
| 2009/0152664 | A1* | 6/2009 | Klem | H01L 27/14603 257/440 |
| 2009/0183992 | A1* | 7/2009 | Fredenberg | B81C 99/0085 205/82 |
| 2009/0184246 | A1* | 7/2009 | Abe | G01J 5/02 250/338.4 |
| 2009/0279099 | A1* | 11/2009 | Wang | G01H 9/004 356/480 |
| 2011/0163364 | A1* | 7/2011 | Kim | H01L 27/14618 257/294 |
| 2011/0176022 | A1* | 7/2011 | Cho | H04N 5/374 348/222.1 |
| 2011/0180711 | A1* | 7/2011 | Tsuchiya | G01J 5/02 250/338.4 |
| 2011/0180712 | A1* | 7/2011 | Murakami | G01J 5/024 250/338.4 |
| 2011/0233408 | A1* | 9/2011 | Noda | G01J 5/02 250/338.3 |
| 2011/0233710 | A1* | 9/2011 | Noda | G01J 5/02 257/467 |
| 2011/0235676 | A1* | 9/2011 | Noda | G01J 5/02 374/163 |
| 2011/0290986 | A1 | 12/2011 | Yon et al. | |
| 2011/0316111 | A1* | 12/2011 | Noda | G01J 5/02 257/467 |
| 2011/0316112 | A1* | 12/2011 | Noda | G01J 5/02 257/467 |
| 2011/0316113 | A1* | 12/2011 | Noda | G01J 5/34 257/467 |
| 2012/0018635 | A1* | 1/2012 | Takizawa | G01J 5/08 250/338.3 |
| 2012/0061569 | A1* | 3/2012 | Noguchi | G01J 5/024 250/338.3 |
| 2012/0104258 | A1* | 5/2012 | Boutami | G01J 5/20 250/349 |
| 2012/0211857 | A1* | 8/2012 | Noda | G01J 5/023 257/467 |
| 2012/0213245 | A1 | 8/2012 | Noda et al. | |
| 2012/0217400 | A1* | 8/2012 | Noda | G01J 5/34 250/338.3 |
| 2012/0217401 | A1* | 8/2012 | Noda | G01J 5/34 250/338.3 |
| 2012/0228504 | A1* | 9/2012 | Maeda | B81B 3/007 250/338.3 |
| 2012/0230364 | A1* | 9/2012 | Maeda | G01J 5/02 374/121 |
| 2012/0235039 | A1* | 9/2012 | Maeda | B81B 3/007 250/338.3 |

FOREIGN PATENT DOCUMENTS

FR  2 977 937 A1  1/2013
WO  WO 2014/031614 A1  2/2014

OTHER PUBLICATIONS

Adriana Lapadatu et al. "High-performance long wave infrared bolometer fabricated by wafer bonding", Proceedings of SPIE, International Society for Optical Engineering, Apr. 2010, 12 pages.
Daisuke Takamuro, et al., "Development of new SOI diode structure for beyond 17 μm pixel pitch SOI diode uncooled IRFPAs", Proc. of SPIE, vol. 8012 (2011), pp. 80121E-1 to 80121E-10.
Adriana Lapadatu, et al., "High-performance long wave infrared bolometer fabricated by wafer bonding", Proc. SPIE, vol. 7660 (2010), 12 pages.
U.S. Appl. No. 14/617,042, filed Feb. 9, 2015, Palanchoke, et al.
U.S. Appl. No. 14/105,663, filed Dec. 13, 2013, Yon, et al.

* cited by examiner

METHOD FOR MAKING AN INFRARED DETECTION DEVICE

TECHNICAL FIELD AND PRIOR ART

The present invention relates to a method for making an infrared detection device, including at least one infrared radiation heat detector which may operate at room temperature, for example of the micro-bolometer type, as well as to such an infrared detection device. The detection device obtained by the method according to the invention may notably be used in the fields of infrared imaging, thermography, management of automation equipment for example in buildings, or further gas detection via an absorption measurement in an infrared spectrum which may be detected by the infrared heat detector.

An infrared detection device generally includes a plurality of infrared radiation detector units, each forming one pixel of the detection device, connected to an electronic readout circuit in charge of making and utilizing signals outputted by the pixels. Each of these infrared heat detectors, or pixels, includes an absorbing membrane suspended through thermally insulating supporting means above a semiconductor (for example silicon) substrate including the electronic readout circuit used for processing the signals outputted by the infrared heat detectors.

Infrared heat detectors may be made with collective microelectronic methods, i.e. all made simultaneously for the whole of the semiconducting plate or substrate or wafer. These collective methods give the possibility of making arrays of infrared heat detectors of high complexity, including a large number of pixels (for example in the form of arrays of 640×480 pixels), and also making a large number of arrays per wafer.

Microelectronic techniques moreover allow integration on the wafer of electronic readout circuits of the VLSI (<<Very Large Scale Integration>>) type capable of reading out an array of pixels. The electronic readout circuit is generally integrated in CMOS technology and in this case includes semiconductor-based deep layers wherein electronic devices are implanted, notably comprising transistors and diodes (<<Front End>> part of the electronic readout circuit) and surface layers in which are provided several levels of electronic interconnections (<<Back End>> part of the electronic readout circuit) in order to notably connect the electronic devices with each other.

An adequate processing of the signals outputted by a large number of pixels may be obtained by making at least as many electric connections as there are pixels between these pixels and the readout circuit. These electric connections are therefore also made themselves in a collective way, according to various technical options which depend on the selected architecture for making the infrared detection device, i.e. the array of infrared heat detectors coupled with its readout circuit.

According to a first architecture (called <<above IC>>, or above the integrated circuit), the array of infrared heat detectors is made above the readout circuit made beforehand on a silicon substrate. The array of detectors is made according to a so-called surface micromachining technique which consists of building infrared heat detectors at the surface of a sacrificial layer arranged between the surface of the readout circuit and the lower face of the detectors. Electric connections are made through the thickness of the sacrificial layer so as to connect the electric terminals of the detectors to the input points of the readout circuit. This sacrificial layer is removed at the end of the manufacturing process in order to end up with the desired suspended membranes and to accordingly obtain their heat insulation relatively to the substrate. This suppression of the sacrificial layer which rests on the surface of the already achieved readout circuit however requires that the method used removes the sacrificial layer without damaging the surface layers of the readout circuit. The result of this is a strong constraint on the nature of the sacrificial layer which is made with an organic material, for example in polyimide, which may be etched with very high selectivity relatively to the mineral layers of the readout circuit. Document U.S. Pat. No. 5,912,464 describes a method for making such architecture.

This first type of architecture however has the drawback of having to resort to an organic material for making the infrared heat detectors, which goes beyond the standard techniques of microelectronics and restricts the means and methods which may be used for making these detectors. This is notably the case of the means for plasma cleaning of the photosensitive resins which cannot be used because of their aggressive and undesirable action on polyimide. The result is therefore a specific manufacturing method, and therefore expensive.

According to a second architecture resorting to a technique called <<bulk micro-machining>>, the array of detectors is simultaneously made and with the same deep layers of CMOS technology as those used for making the electronic devices of the readout circuit. The document of D. Takamuro et al., <<Development of new SOI diode structure for beyond 17 µm pixel pitch SOI diode uncooled IRFPAs>>, Proc. SPIE, Vol. 8012 (2011) describes an example of such a structure where each infrared heat detector of the array consists of several silicon PN junctions connected in series and forward-biased.

According to this architecture, the infrared heat detectors and the electronic devices of the readout circuit are integrated into a same plane located in the deep layers, in CMOS technology. The infrared heat detectors and the readout circuit are juxtaposed and share the surface area available on the silicon substrate. The electric connections between the heat detectors and the readout circuit are horizontal and are made by using at least one portion of the layers of CMOS technology. The suspended nature and the heat insulation are obtained by localized etching of the silicon under said PN junctions of the heat detectors. The propagation of the etching of the silicon in a plane parallel to the surface of the substrate is controlled by essentially vertical trenches which insulate the silicon areas provided for integrating the detectors from those used for the readout circuit. The propagation of the etching in a direction perpendicular to the plane of the substrate is as for it determined by the duration of the etching process.

Although this type of architecture avoids the use of an organic sacrificial layer, a first drawback of this second architecture is that it requires the making of deep trenches for stopping the side etching of the semiconductor, which burdens the manufacturing cost of the device. A second drawback results from the ratio of the surface area used for making the infrared heat detectors relatively to the total surface area available for the pixels, otherwise called a filling factor which is lower than the one for a superposed <<above IC>> architecture. It follows that a portion of the infrared radiation which illuminates the pixels is not captured by the detectors, the detection performance is reduced by as much. In order to find a remedy to this second drawback, the document of D. Takamuro et al. mentioned earlier provides the addition of absorbing suspended structures covering the essential part of the surface of the pixel. However, in addition to increase in the complexity, this addition introduces additional thermal inertia on the one hand and requires a manufacturing method by surface micromachining on the other hand which has the same drawbacks as those already mentioned for the previous architecture, notably the use of an organic sacrificial material. Finally, a third drawback corresponds to less surface area being dedicated to the electronic devices of the readout circuit which limits the signal processing capabilities of the readout circuit, most particularly when the question is to integrate electronic functions within the pixels.

According to a third so-called hybrid architecture, the infrared detection device is obtained by assembling two substrates. The first substrate includes readout circuits already made in the form of integrated circuits on the first substrate. The second substrate includes arrays of heat detectors provided so that each of them is connected to a readout circuit of the first substrate. The assembling of both substrates may be achieved with a flip-chip interconnection, for example in the form of an assembly by welding of metal balls. Another option is to assemble both substrates by direct adhesive bonding (direct bonding).

The advantage provided by hybrid architecture is to be able to provide arrays of infrared heat detectors on a separate substrate and independent from the CMOS substrate which includes readout circuits. With this independence, it is notably possible to use methods carried out at a high temperature which are of a nature for improving the quality of the heat detectors but which cannot be used with the two preceding architectures since they would lead to deterioration of the CMOS substrate because of the temperatures set into play, which may be greater than about 400° C.

The document of A. Lapadatu et al., <<High performance long wave infrared bolometer fabricated by wafer bonding>>, Proc. SPIE, Vol. 7660 (2010), describes two hybrid assembly examples giving the possibility of connecting a first substrate comprising already completed readout circuits with a second substrate comprising infrared heat detectors consisting of Si/SiGe quantum multi-well thermistors. In a first example of an assembly, the surface of each of the two substrates is covered with $SiO_2$ and they are then assembled by adhesive bonding at a low temperature, oxide against oxide. The electric connections between detectors and readout circuits are made a posteriori by making an electric contact through the whole thickness of the detector and the whole thickness of both $SiO_2$ layers, in relation with receptacle devices arranged on the substrate of the readout circuits and made prior to the adhesive bonding. In a second example, electric connections made of copper are provided at the surface at each of the two substrates which are then assembled by thermo-compression copper against copper. In order to improve the mechanical robustness of the assembly, the copper electric connections are integrated into an oxide layer from which they crop out. A hybrid bonding is thereby obtained, essentially oxide against oxide, and locally copper against copper at the electric connections. For each of the two assembly examples, the suspended nature and the thermal insulation of the detectors are obtained by acid etching in an HF vapor medium which selectively etches the oxide layers used for the bonding of both substrates while preserving the metal electric connections which guarantee the electric and mechanical contact functions between the terminals of the detectors and the inputs of the readout circuit.

This hybrid architecture is advantageous in order to obtain detectors of very high performance, by the possibility that it provides for optimizing a detector independently of the technological constraints related to the presence of a CMOS technology on a same substrate. On the other hand, it implies higher manufacturing costs since it requires that two technologies be achieved on two separate substrates and additional assembling operations which may burden the cost and the manufacturing yield of the assembly.

DISCUSSION OF THE INVENTION

Thus there is a need to propose an infrared detection device and a method for making an infrared detection device not having the drawbacks of the prior art, i.e. avoiding:
the use of an organic sacrificial material,
the making of deep trenches for stopping etching in semiconductor layers,
the reduction of the ratio of the used surface area for making the infrared heat detectors relatively to the total surface area available for the pixels,
the increase in the thermal inertia of the infrared heat detectors,
the reduction in the surface area dedicated to the electronic devices of the readout circuit, and
the increase of the manufacturing cost of the device due to a hybrid architecture of the device.

For this, a first method for making an infrared detection device is proposed, including at least the implementation of the steps for:
depositing an etching stop layer on an electronic readout circuit made on and/or in a first semiconducting substrate;
depositing a first sacrificial layer on the etching stop layer, the first sacrificial layer comprising at least one mineral material capable of being selectively etched relatively to the etching stop layer;
making on the first sacrificial layer at least one infrared heat detector electrically connected to the electronic readout circuit through at least one first electrically conducting via made through the first sacrificial layer;
etching at least one portion of the first sacrificial layer arranged between the electronic readout circuit and the infrared heat detector.

One embodiment also relates to a second method for making an infrared detection device, including at least the implementation of steps for:
making several levels of electrical interconnections on an electronic readout circuit made on and/or in a first semiconducting substrate and forming a stack ranging from a first level of electrical interconnections to a penultimate level of electrical interconnections;
depositing an etching stop layer on the penultimate level of electrical interconnections;
depositing a first inter-metal dielectric layer on the etching stop layer, the first inter-metal dielectric layer comprising at least one mineral material capable of being selectively etched relatively to the etching stop layer;
making on the first inter-metal dielectric layer a last level of electrical interconnections forming at least one connection pad electrically connected to the electronic readout circuit through at least one second electrically conducting via of the last level of electrical interconnections which crosses the first inter-metal dielectric layer and the etching stop layer, the connection pad being able to be electrically contacted from the outside of the infrared detection device, and at least one infrared heat detector electrically connected to the electronic readout circuit through at least one first electrically conducting via of the last level of electrical interconnections which crosses the first inter-metal dielectric layer and the etching stop layer, the first and the second electrically conducting vias being respectively connected electrically to first and second portions of a metal line of the penultimate level of electrical interconnections, and wherein the infrared heat detector and the connection pad are each spaced apart from the etching stop layer by a non-zero distance substantially equal relatively to each other;

etching at least one portion of the first inter-metal dielectric layer arranged between the electronic readout circuit and the infrared heat detector, forming an empty space surrounding the first electrically conducting via and extending under the infrared heat detector.

The method therefore proposes the making of an infrared detection device formed with at least one or an array of infrared heat detectors connected to an electronic readout circuit through at least as many electric connections, formed with one or several electrically conducting vias, as there are infrared heat detectors. The infrared heat detector(s) is(are) made above the electronic readout circuit so as to obtain a high filling factor. Considering the use of a mineral sacrificial material corresponding to an inter-metal dielectric layer, the first electrically conducting via is therefore made in the surface layers of the readout circuit (back end portion), which simplifies the manufacturing and reduces the production costs of the infrared detection device. Further, such a method does not require the making of deep trenches for stopping etching in semiconducting layers because the infrared heat detector(s) is(are) made above the deep semiconductor layers of the electronic readout circuit, which further does neither reduce the ratio of the surface area used for making the infrared heat detectors relatively to the total surface area available for the pixels, nor the surface dedicated to the electronic devices of the readout circuit. Finally, the manufacturing cost of such a device is reduced relatively to hybrid architecture of infrared detection device.

The term "mineral material" here concerns a material which enables the making of an inter-metal dielectric layer, that is an electrically insulating material, with for example a dielectric constant, or relative permittivity, less than or equal to 3.9, which enables to limit the parasitic capacitance between interconnections. It concerns a material having no carbon chain, such as SiOx or SiNx, or an organosilicate material such as SiOC or SiOCH, or a fluoride glass material such as SiOF.

The infrared heat detector is advantageously made at the last level of electrical interconnections, or at the last metallization level, formed on the electronic readout circuit, this last level of electrical interconnections also forming the connection pad(s) of the electronic readout circuit. Thus, the last inter-metal dielectric layer (or IMD for inter-metal dielectric) arranged between the last level of electrical interconnections and the penultimate level of electrical interconnections is advantageously used as a sacrificial layer for producing an empty space extending under the infrared heat detector and therefore forming an optical cavity of the infrared heat detector within this last inter-metal dielectric layer. This optical cavity of the infrared heat detector is therefore made under the last level of electrical interconnections of the electronic readout surface. The infrared heat detector(s) is(are) therefore made at the same level as the connection pad(s) of the electronic readout circuit, i.e. at the same level as the last level of electrical interconnections. The infrared heat detector(s) and the connection pad(s) are therefore substantially at a same distance relatively to the etching stop layer which is arranged on the penultimate level of electrical interconnections and which gives the possibility of delimiting the etching limit during the making of the optical cavity(ies) of the infrared heat detector(s).

The levels of electrical interconnections are made on the electronic readout circuit above each other and give the possibility of making the different electrical interconnections between various elements of the electronic readout circuit and/or between the electronic readout circuit and other electric/electronic elements of the infrared detection device. Each level of electrical interconnections includes one or several disconnected portions of a metal line substantially extending parallel to the etching stop layer, this or these portions being connected to the metal line(s) of the neighboring electrical interconnection level(s) (located above and/or underneath the relevant level of electrical interconnections) with electrically conducting vias extending substantially perpendicularly to the metal lines through the inter-metal dielectric layers. Each inter-metal dielectric layer separates two levels of neighboring electrical interconnections and may be substantially planar and extend substantially parallel to the etching stop layer.

In this embodiment, at least two levels of electrical interconnections are made on the electronic readout circuit. When only two levels of electrical interconnections are made on the electronic readout circuit, the penultimate level of electrical interconnections in this case corresponds to the first level of electrical interconnections. The first level of electrical interconnections corresponds to the closest level of electrical connections to the electronic readout circuit.

The sacrificial layer specified in the first method corresponds to the first inter-metal dielectric layer specified in the second method. Further the second electrically conducting via specified in the second method corresponds to the third electrically conducting via, subsequently specified for the first method.

In the case of the first method, the electronic readout circuit may include a plurality of electronic devices of the MOS type made on and/or in the first semiconducting substrate, and at least one level of electrical interconnections including a metal line and seconds electrically conducting vias made in a dielectric layer and electrically connecting first portions of the metal line to electronic devices of the MOS type, and wherein the etching stop layer may be deposited on said dielectric layer, and the first electrically conducting via may be electrically connected to at least one of the first portions of the metal line. In the case of the second method, the electronic readout circuits may include a plurality of electronic devices of the MOS type made on and/or in the first semiconducting substrate, and the penultimate level of electrical interconnections may include third electrically conducting vias made in a second inter-metal dielectric layer and electrically connecting at least first portions of the metal line to the electronic devices of the MOS type, and wherein the etching stop layer may be deposited on the second inter-metal dielectric layer.

The third electrically conducting vias specified in the second method correspond to the second electrically conducting vias specified in the first method.

Thus, the first electrically conducting via may be made in one or several (by two or even by three) of the last levels of electrical interconnections of the electronic readout circuit, and the infrared heat detector may be made at the same level as connection pads of the electronic readout circuit. Further, the infrared heat detector is electrically connected to the electronic readout circuit through the first electrically conducting via of the last level of electrical interconnections, the first portion of the metal line of the penultimate level of electrical interconnections and one of the third (or second in the case of the first method) electrically conducting vias of the penultimate level of electrical interconnections. If more than two levels of electrical interconnections are made on the electronic readout circuit, via(s) and portion(s) of metal line(s) of other level(s) of electrical interconnections may then be part of the electric connection between the infrared heat detector and the electronic readout circuit. Also, one of the third (or second in the case of the first method) electrically conducting vias may be used in order to form the electric connection between the connection pad and the electronic readout circuit, this electric connection further including the second (or third in the case of the first method) electrically conducting via and the second portion of the metal line of the penultimate level of electrical interconnections In the case of the first method, the metal line and the second electrically conducting vias of the level of electrical interconnections may comprise at least one material similar, that is the same material, to the one of the first electrically conducting via, and wherein the dielectric layer may comprise a mineral material similar, that is the same material, to the mineral material of the first sacrificial layer. In the case of the second method, the metal line and the third electrically conducting vias may comprise at least one material similar to the one of the first electrically conducting via, and the second inter-metal dielectric layer may comprise a mineral material similar to the mineral material of the first inter-metal dielectric layer. Generally, all these vias and metal lines of the different levels of electrical interconnections made on the electronic readout circuit may be made with one or several same materials. Further, all the inter-metal dielectric layers made on the electronic readout circuit may be made in a same material.

Thus, the steps related to the making of the first electrically conducting via and (at least partly) of the infrared heat detector may be carried out with techniques from microelectronics similar to those related to the making of the different levels of electrical interconnections of the electronic readout circuit.

The first method may further include, between the step for depositing the first sacrificial layer and the step for making the infrared heat detector, the making of the first electrically conducting via and of third electrically conducting vias through the first sacrificial layer, the third electrically conducting vias being electrically connected to second portions of the metal line. The third electrically conducting vias may allow the making of electric connection pads of the electronic readout circuit.

In the first and second methods, at least one third portion of the metal line may be arranged facing the infrared heat detector and be capable of reflecting at least one part of infrared radiation intended to be detected by the infrared heat detector.

Thus, the metal line of the penultimate level of electrical interconnections may also be used for making an optical reflector arranged facing the infrared heat detector. It is notably possible that the infrared heat detector coupled with this reflector forms a quarter-wave interferential cavity having a resonance peak at the wavelength intended to be detected by the infrared heat detector.

The first or the second method may further include, between the step for depositing the etching stopping layer and the step for depositing the first sacrificial layer or first inter-metal dielectric layer, a step for etching a portion of the etching stop layer which covers the third portion of the metal line. The optical quality of the interferential cavity formed between the infrared heat detector and the reflector is thus improved.

The mineral material of the first sacrificial layer or first inter-metal dielectric layer may be a non-doped oxide, for example non-doped silicon oxide.

Generally, each of the inter-metal dielectric layers may comprise a non-doped oxide, such as silicon oxide, or comprise silicon nitride, or further comprise SiOC or SiOCH.

According to a first embodiment of the first or the second method, the making of the infrared heat detector may include the making of a metal-insulator-metal stack capable of absorbing infrared radiation intended to be detected by the infrared heat detector, and the making of at least one portion of material the resistivity of which varies according to temperature, thermally coupled with the metal-insulator-metal stack and electrically connected to the first electrically conducting via. In such an infrared heat detector, the metal-insulator-metal structure therefore forms an absorbent element of the infrared heat detector, this absorbent element being coupled with a thermometric element comprising the material for which the resistivity varies according to temperature, which is connected to the first electrically conducting via, and therefore to the electronic readout circuit.

According to a second embodiment of the first or second method, the making of the infrared heat detector may include the making of a plurality of resistive portions capable of absorbing infrared radiation intended to be detected by the infrared heat detector, and the making of a plurality of portions of material for which the resistivity varies according to temperature, at least one of said portions of material for which the resistivity varies according to temperature being electrically connected to the first electrically conducting via. In such an infrared heat detector, the resistive, for example metal, portions form the absorbent elements of the infrared heat detector, these absorbent elements being coupled with thermometric elements comprising the material for which resistivity varies according to temperature, at least one element of which is connected to the first electrically conducting via and therefore to the electronic readout circuit.

The first or the second method may further include, between the step for depositing the first sacrificial layer, or first inter-metal dielectric layer, and the step for making the infrared heat detector, and for example after making the first electrically conducting via, the making of at least one electric contact on the first electrically conducting via, the infrared heat detector being electrically connected to the first electrically conducting via, via said electric contact, and further including, when the first method includes the making of the third electrically conducting vias, the making of at least one second electric contact on the third electrically conducting vias. The second electric contact may notably form, at least partly, a connection pad of the readout circuit giving electrical access to the electronic readout circuit, and more generally to the infrared detection device, from the outside of the infrared detection device. This second electric contact corresponds to the connection pad specified in the second method.

The first method may further include, between the step for making the infrared heat detector and the step for etching at least one portion of the first sacrificial layer, the implementation of the steps for:

depositing a second sacrificial layer covering at least the infrared head detector, the second sacrificial layer comprising at least one mineral material able to be etched selectively relatively to the etching stop layer;

etching at least one trench through at least the first sacrificial layer and the second sacrificial layer and delimiting portions of the first sacrificial layer and of the second sacrificial layer;

depositing in said trench and on the portion of the second sacrificial layer, at least one encapsulation layer comprising a material transparent to infrared radiation intended to be detected by the infrared heat detector;

making at least one aperture through the encapsulation layer;

wherein the step for etching at least one portion of the first sacrificial layer is achieved via the aperture and removes said portions of the first sacrificial layer and of the second sacrificial layer such that the infrared heat detector is encapsulated in a cavity delimited by at least the encapsulation layer and the etching stop layer, and further including, after said etching step, the implementation of a step for obturating the aperture.

The second method may further include, between the step for making the infrared heat detector and the step for etching at least one portion of the first inter-metal dielectric layer, the implementation of steps for:

depositing a sacrificial layer covering at least the infrared heat detector, the sacrificial layer comprising at least one mineral material able to be selectively etched relatively to the etching stop layer;

etching at least one trench through at least the first inter-metal dielectric layer and the sacrificial layer and delimiting portions of the first inter-metal dielectric layers and of the sacrificial layer;

depositing in said trench and on the portion of the sacrificial layer, at least one encapsulation layer comprising a material transparent to infrared radiation intended to be detected by the infrared heat detector;

making at least one aperture through the encapsulation layer;

wherein the step for etching at least one portion of the first inter-metal dielectric layer is achieved via the aperture and removes said portions of the first inter-metal dielectric layer and of the sacrificial layer such that the infrared heat detector is encapsulated in a cavity delimited by at least the encapsulation layer and the etching stop layer, and further including, after said etching step, the implementation of a step for plugging the aperture.

According to an alternative, the first or the second method may further include between the step for making the infrared heat detector and the step for etching at least one part of the first sacrificial layer or first inter-metal dielectric layer, the implementation of a step for making at least a metal bead on the etching stop layer, through at the least the first sacrificial layer or first inter-metal dielectric layer, and further including after the step for etching at least one part of the first sacrificial layer or first inter-metal dielectric layer, the securing of at least one second substrate to the metal bead such that the infrared heat detector is encapsulated in a cavity delimited by at least the second substrate, the etching stop layer and the metal bead, the second substrate comprising at least one material transparent to infrared radiation intended to be detected by the infrared heat detector.

The method may include the making of a plurality of infrared heat detectors forming an array of pixels of the infrared detection device, each infrared heat detector may be electrically connected to the electronic readout circuit through at least one electrically conducting via.

It is also proposed an infrared detection device, including at least:

an electronic readout circuit made on and/or in a first semi-conducting substrate, and on which are arranged several levels of electrical interconnections such that a first level of electrical interconnections is arranged between the electronic readout circuit and a last level of electrical interconnections;

an etching stop layer arranged between the last and a penultimate level of electrical interconnections and able to resist the, or capable of withstanding, etching of a first inter-metal dielectric layer arranged between the etching stop layer and the last level of electrical interconnections;

an infrared heat detector electrically connected to the electronic readout circuit through at least one first electrically conducting via of the last level of electrical interconnections which crosses the etching stop layer;

a connection pad formed by the last level of interconnections, electrically connected to the electronic readout circuit through at least one second electrically conducting via of the last level of electrical interconnections which crosses the etching stop layer and able to be electrically contacted from the outside of the infrared detection device;

wherein the infrared heat detector and the connection pad are each spaced apart from the etching stop layer by a non-zero distance substantially equal relatively to each other, wherein the first and second electrically conducting vias are respectively electrically connected to first and second portions of a metal line of a penultimate level of electrical interconnections, and wherein an empty space formed in the first inter-metal dielectric layer surrounds the first electrically conducting via and extends under the infrared heat detector.

The electronic readout circuit may include a plurality of electronic devices of the MOS type made on and/or in the first semiconducting substrate, the penultimate level of electrical interconnections may include third electrically conducting vias made in a second inter-metal dielectric layer and electrically connecting at least first portions of the metal line to the electronic devices of the MOS type, and wherein the etching stop layer is arranged on the second inter-metal dielectric layer.

The metal line and the third electrically conducting vias may comprise at least one material similar to the one of the first electrically conducting via.

At least one third portion of the metal line may be arranged facing the infrared heat detector and be able to reflect at least one part of the infrared radiation intended to be detected by the infrared heat detector.

The third portion of the metal line may not be covered by the etching stop layer.

The infrared heat detector may include a metal-insulator-metal stack able to absorb infrared radiation intended to be detected by the infrared heat detector, and at least one portion of material, the resistivity of which varies according to temperature, thermally coupled with the metal-insulator-metal stack and electrically connected to the first electrically conducting via.

Alternatively, the infrared heat detector may include a plurality of resistive portions capable of absorbing infrared radiation intended to be detected by the infrared heat detector, and a plurality of portions of material the resistivity of which varies according to temperature, at least one of said portions of material the resistivity of which varies according to temperature being electrically connected to the first electrically conducting via.

The infrared detection device may further include at least one first electric contact arranged on the first electrically conducting via, the infrared heat detector may be electrically connected to the first electrically conducting via, via said electric contact.

The infrared heat detector may be encapsulated in a cavity delimited at least by an encapsulation layer comprising a material transparent to infrared radiation intended to be detected by the infrared heat detector, and by the etching stop layer.

Alternatively, the infrared heat detector may be encapsulated in a cavity delimited by at least one second substrate, the etching stop layer and a metal bead securing the second substrate to the etching stop layer, the second substrate may comprise at least one material transparent to infrared radiation intended to be detected by the infrared heat detector.

The infrared detection device may include a plurality of infrared heat detectors forming an array of pixels of the infrared detection device, each infrared heat detector being electrically connected to the electronic circuit through at least one first electrically conducting via.

SHORT DESCRIPTION OF THE DRAWINGS

The present invention will be better understood upon reading the description of exemplary embodiments given purely as an indication and by no means as a limitation with reference to the appended drawings wherein.

Identical, similar or equivalent portions of the different figures described hereafter bear the same numerical references, so as to facilitate passing from one figure to the other.

The different portions illustrated in the figures are not necessarily at a uniform scale, in order to make the figures more legible.

The different possibilities (alternatives and embodiments) should be comprised as not being exclusive of each other and may be combined together.

DETAILED DISCUSSION OF PARTICULAR EMBODIMENTS

In connection with FIGS. 1 to 6, a method for making an infrared detection device 100 according to a first embodiment is now described.

Figure 1:
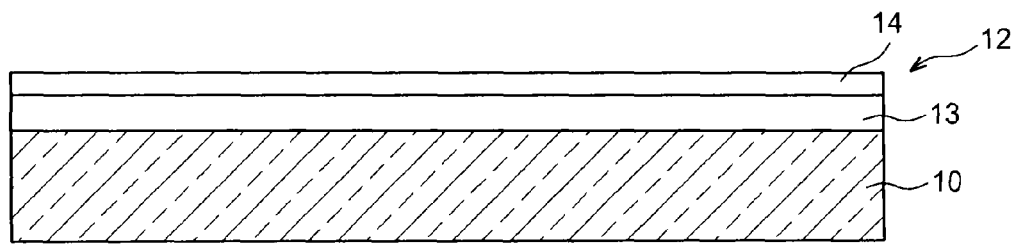
FIGS. 1 to 6 illustrate the steps of a method for making an infrared detection device according to a first embodiment.

The infrared detection device 100 includes a plurality of heat detectors of the microbolometer type, which will be made from a semiconducting substrate 10, for example made of silicon, on and/or in which is integrated an electronic readout circuit 12 made in CMOS technology. The electronic readout circuit 12 includes deep electronic layers 13 (front end portion) comprising semiconducting layers, in which are made transistors, diodes, capacitors and other electronic devices of the MOS type allowing implementation of the electronic functions of the readout circuit 12. One or several levels of electrical interconnections 14 (back end portion) notably connecting functional blocks of the readout circuit 12 together and intended to form input/output connections of the readout circuit 12, are made on deep electronic layers 13 of the readout circuit 12. On the other hand, the last level of electrical interconnections intended to form the electric contacts of the readout circuit 12 has not yet been achieved at the stage illustrated in FIG. 1. In FIG. 1, reference 14 may therefore refer to a single level of electrical connections, both corresponding to the first level of electrical interconnections and to the penultimate level of electrical interconnections, or else to several levels of electrical interconnections stacked from the first level of electrical interconnections (the one in contact with the electronic layers 13) up to the penultimate level of electrical interconnections. The last level of electrical interconnections will be made so as to be used as a mechanical supporting means for the infrared heat detectors intended to be made and suspended above the readout circuit 12, and as an electrical connection means between the inputs of the readout circuit 12 accessible from the levels of electrical interconnections 14 and the output electrical connections of the infrared heat detectors. This last level of electrical interconnections will also be made in order to form electrical connection pads of the readout circuit 12 accessible from the outside, i.e. which may be electrically contacted from the outside of the infrared detection device 100. Alternatively, it is possible to use several (for example 2 or 3) of the last levels of electrical interconnections so as to serve as a mechanical supporting means for the infrared heat detectors and as an electrical connection means between the inputs of the readout circuit 12 and the output electric connections of the infrared heat detectors.

Figure 2:
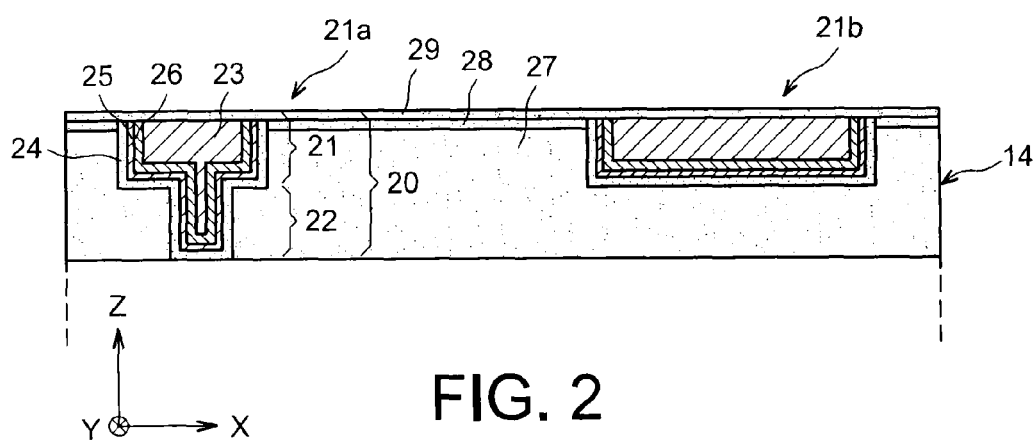

FIG. 2 illustrates the achieved penultimate level of electrical interconnections 20, being part of the levels of electrical interconnections 14. This level of electrical interconnections 20 includes a metal line 21, including first portions 21a (a single first portion 21a is illustrated in FIG. 2) which are electrically and locally connected through electrically conducting vias 22 or vertical connections and optionally via the lower level(s) of electrical interconnections, to the MOS electronic devices of the readout circuit 12. These first portions 21a are intended to be electrically connected to the infrared heat detectors. Except for the vias 22 which ensure the electric connections with the lower level of electrical interconnections, the level of electrical interconnections 20 is electrically insulated from the metal line of the lower level of electrical interconnections by a dielectric layer 27, called an inter-metal dielectric layer (also called IMD, or <<Intermetal Dielectric>>), for example comprising non-doped silicon oxide (also called USG, or <<Undoped Silica Glass>>) or an oxide of lower dielectric permittivity, such as SiOF, SiOC, SiOCH, etc. Second portions 21b (a single second portion 21b is illustrated in FIG. 2) of the metal line 21, either connected or not to the lower interconnection level, are not intended to be connected to the infrared heat detectors but to be used for example for at least partly making connection pads used for testing and wire cabling of the readout circuit 12 and of the detection device 100 in general. In the example of FIG. 1, the second portion 21b of the metal line 21 of the penultimate level of electrical connections 20 is therefore electrically connected to the electronic readout circuit 21 through an electrical connection which is not visible in this figure.

Different technical options are possible for making the vias 22 and the metal line 21 of the penultimate level of electrical interconnections 20 (and also the metal lines and the vias of the other levels of electrical interconnections 14). A first possibility consists of making the metal line 21 from aluminum advantageously inserted between two layers of titanium or titanium nitride, and of making the vias 22 with tungsten. A second possibility is to make the metal line 21 and the vias 22 with copper according to a damascene process which consists of filling trenches formed in the dielectric layer 27 or inter-metal dielectric layer, with copper. This may be a simple damascene process in which the vias 22 and then the metal line 21 are made in two successive damascene steps, or else a double damascene process as illustrated in FIG. 2, wherein the metal line 21 and the vias 22 are integrated into a <<continuous>> manufacturing process. The core of these elements 21 and 22 is formed by copper portions 23 made by electrolysis of a copper salt in solution (ECD deposition). The lower faces and the side faces of these copper portions 23 are further coated with a set of conducting layers, for example of tantalum nitride 24, of tantalum 25 and of copper 26, advantageously made by ionized sputtering (also called IPVD) in order to improve the covering of these deposits on the vertical flanks. The tantalum layer 25 forms a barrier layer preventing diffusion of copper 23 and 26 into the inter-metal dielectric 27 and towards the deep layers 13 of the readout circuit 12 where this copper would otherwise generate electrical defects notably in transistors and diodes. The tantalum nitride layer 24 is generally provided for improving the adhesion of the tantalum layer 25 to the surface of the inter-metal dielectric 27. The copper layer 26 is used both as a cathode and a germination layer for electrolytic growth of copper portions 23. Making the interconnection level 20 flush with the surface of the inter-metal dielectric 27 is obtained by a chemical mechanical polishing (CMP) process controlled by a stop layer 28 for example comprising $SiO_2$. An insulating dielectric layer 29, for example comprising silicon nitride, covers the stop layer 28 and the upper faces of the portions 21a, 21b of the metal line 21, thereby forming a diffusion barrier towards copper.

Figure 3:
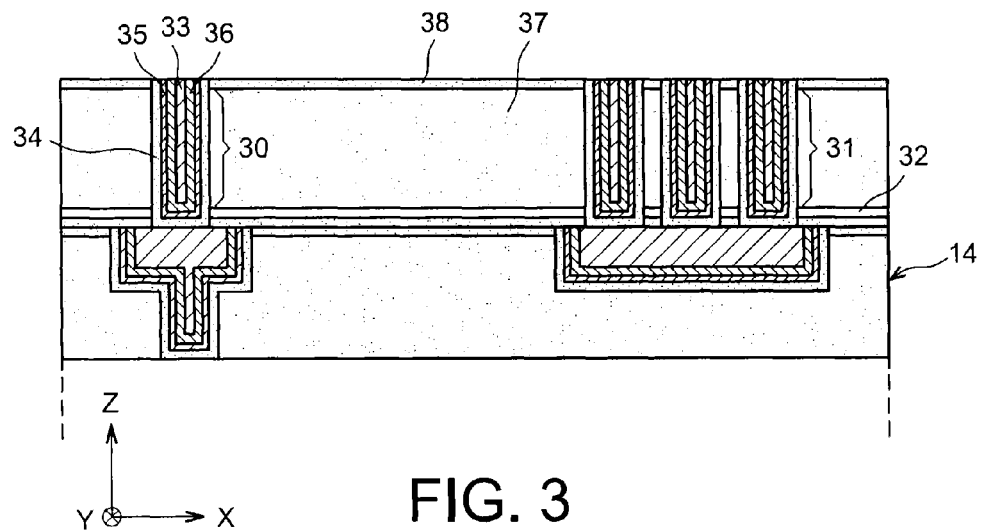

An etching stop layer 32 is then deposited on the insulating dielectric layer 29 (FIG. 3). The etching stop layer 32 is made such that it is hermetically sealed, electrically insulating (dielectric) and chemically inert towards an acid attack in a HF (hydrofluoric acid) medium which will be carried out subsequently for obtaining the suspended membranes of the infrared heat detectors. The etching stop layer 32 is for example made by deposition of alumina ($Al_2O_3$) achieved by ALD (Atomic Layer Deposition) which has the advantage of providing compliant, dense deposits with very little defects. Other deposition techniques may however be suitable such as for example sputtering or evaporation. The etching stop layer 32 for example has a thickness between 20 nm and 150 nm. Other materials may also be used for making the etching stop layer 32, for example aluminum nitride, aluminum trifluoride, or further intrinsic amorphous silicon for example deposited by plasma enhanced chemical vapor deposition (PECVD).

The etching stop layer 32 is made in the close vicinity of the metal line 21 of the penultimate layer of electrical interconnections 20. This means that the distance between the etching stop layer 32 and the metal line 21 is less than the distances between the etching stop layer 32 and the metal line(s) of the other levels of electrical interconnections. In the example described here, the etching stop layer 32 is separated from the metal line 21 only by the insulating dielectric layer 29 forming the diffusion barrier. It is also possible that the etching stop layer 32 be in direct contact with the metal line 21 if the insulating dielectric layer 29 is omitted.

A sacrificial layer 37, for example comprising USG, is deposited on the etching stop layer 32 for example by PECVD deposition of a tetraethyl orthosilicate precursor compound (TEOS). The thickness of the sacrificial layer 37 may be adjusted via the duration of the deposition carried out, so as to obtain a thickness (dimension along the axis Z) for example between about 1 μm and 5 μm. The thickness of the sacrificial layer 37 is notably selected depending on the desired absorption properties towards infrared radiation intended to be received by infrared heat detectors of the infrared detection device 100 (properties are detailed later on). A layer 38, for example comprising $SiO_2$, is then deposited on the sacrificial layer 37 in order to form a stop layer for subsequently carried out planarization. The sacrificial layer 37 corresponds to another inter-metal dielectric layer intended to separate the metal line 21 belonging to the penultimate level of electrical connections 20 from the metal line of the last level of electrical interconnections which will then be made.

Through the layers 29, 32, 37 and 38 made above the metal line 21, electrically conducted portions 30 are then made, electrically connected to the first portions 21a of the metal line 21, as well as electrically conducting portions 31 electrically connected to the second portions 21b of the metal line 21. The electrically conducting portions 30 and 31 form electrically conducting vias crossing the layers 29, 32, 37 and 38. In order to make these vias 30 and 31, areas are defined by photolithography and then successively etched through the layers 38, 37, 32 and 29, thereby forming cavities in which the vias 30, 31 are intended to be formed, for example by a simple damascene or double damascene process. After the filling of these cavities with the electrically conducting material(s) of these vias 30 and 31, CMP is carried out in order to obtain the configuration illustrated in FIG. 3. The vias 30 and 31 preferentially have the shape of a small column with a square section for example between about 0.25 $\mu m^2$ and 5 $\mu m^2$, and a height equivalent to the sum of the thicknesses of the layers 29, 32, 37 and of the remaining thickness of the layer 38 after CMP, i.e. a height for example between about 1 μm and 5 μm, approximately corresponding to that of the sacrificial layer 37 taking into account the small thicknesses of the layers 29, 32 and 38 relatively to that of the sacrificial layer 37.

The making of the vias 30 and 31 by a damascene process gives the possibility of making metal patterns of highly varied geometries. For example they are made in the form of a stack of layers similar to the one forming the vias 22 and the metal line 21. In the example of FIG. 3, the vias 30 and 31 are formed by an adhesion layer 34 deposited against the walls of the cavities formed through the layers 29, 32, 37 and 38, a barrier layer 35 deposited on the adhesion layer 34, a germination layer 36 deposited on the barrier layer 35 and a core 33 made of copper filling the remaining space of the cavities. Alternatively, more resistant materials against an HF acid attack may be used for making the vias 30 and 31. As an example, a TiN layer, preferentially made by MOCVD for improving its density may advantageously replace the layers 34 and 35 by both playing the role of adhesion layer and of a barrier layer to diffusion of copper. The layers 34 and 35 may also be replaced with a layer of a titanium and tungsten alloy (TiW), for example comprising about 30% of titanium and about 70% of tungsten. It is also possible to interpose in the cavities, prior to the depositions of the layers 34, 35 and 36, a first electrically conducting layer for example comprising SiC deposited by PECVD, so as to form a protective envelope around the vias 30 and 31. This protective layer may optionally replace the adhesion layer 34.

Each via 30 is intended to form an electrical connection between a first portion 21a of the metal line 21 (a portion connected to the readout circuit 12) and one of the infrared heat detectors. At each of the second portions 21b intended to form (input and/or output) connection pads of the infrared detection device 100, one or several vias 31 may be made such that half of the surface of each of the second portions 21b is intended to be electrically in contact with these vias 31. Between the vias 30 and 31, it is possible to further provide so-called "ghost" metal patterns (in the sense that they do not have any electrical usefulness) i.e. electrically conducting portions made in a similar way to the vias 30 and 31 through the layers 29, 32, 37 and 38 but electrically connected to no other element of the readout circuit (or optionally electrically connected to "ghost" metal line portions, i.e. not electrically connected to the readout circuit), i.e. not connected to the metal line 21, with a density between 20% and 80% (this density corresponding to the space occupied by these vias relatively to the total space where these vias are located) so as to improve the CMP operation of the damascene process.

This intermediate area between the vias 30 and 31 may also be used for integrating one or several metal lines formed with the layers 34, 35, 36, 33, in the layers 29, 32, 37 and 38 for interconnecting the electronic functions of the underlying readout circuit 12. The electrically conducting portions made through the layers 29, 32, 37 and 38 may alternatively be made with tungsten deposited by CVD in the form of a compliant tungsten layer, struck off by CMP at the surface of the layer 38.

Figure 4:
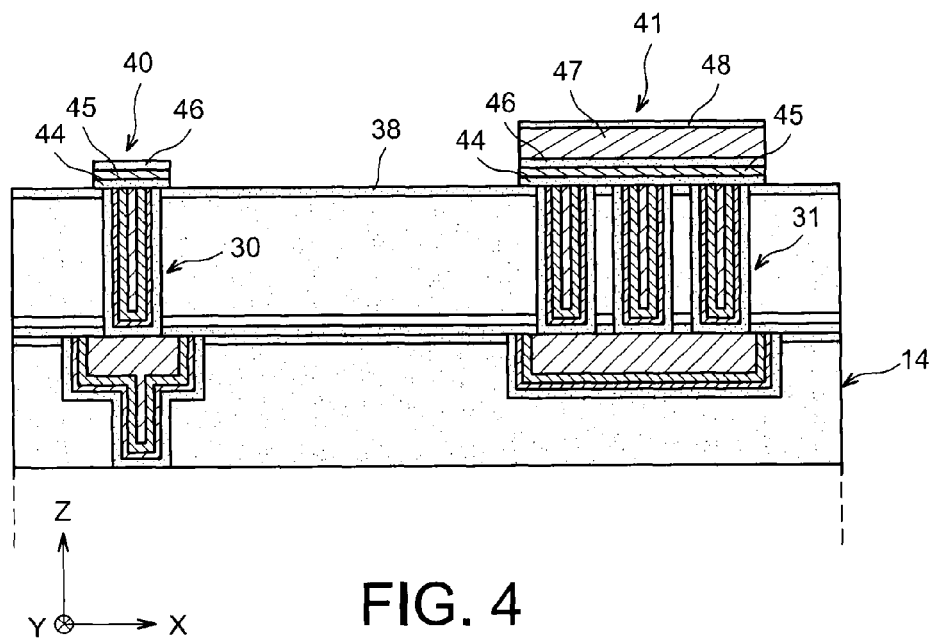

As illustrated in FIG. 4, an electrically conducting layer 44 forming a diffusion barrier to copper, for example comprising TaN, is deposited on the layer 38 and on the tops of the vias 30 and 31. A titanium layer 45 and a titanium nitride layer 46 are then deposited on the electrically conducting layer 44 in order to improve contact with an aluminum layer 47 deposited on the TiN layer 46, itself covered with a thin layer of titanium and/or titanium nitride 48 allowing improvement in the photolithographic operations on aluminum and for improving the robustness of the aluminum of the layer 47 towards electromigration phenomena and avoiding the formation of protrusions. The aluminum of the layer 47 may be alloyed with silicon and/or copper.

In an alternative, the barrier layer 44 may comprise TiN which is more resistant towards an acid attack in a HF medium, preferentially formed by MOCVD for promoting its density, and with a thickness at least equal to 50 nm so as to provide it with properties required for generating a sufficient diffusion barrier to copper. According to this alternative, the titanium layer 45 may be omitted and the TiN layer 46 may be made by sputtering.

First electrical contacts 40 and second electrical contacts 41, respectively arranged above the vias 30 and 31, are then made by photolithography and etching of the layers 48, 47, 46, 45 and 44, until they attain the layer 38 used as an etching stop layer. A new step of photolithography and etching is carried out in order to suppress the remaining portions of the layers 48 and 47 at the first electric contacts 40. Successive etching of these portions of the layers 48 and 47 is carried out by using selective etching chemistry towards the material of the layer 46, for example by using an etching process including at least two steps and ending with a wet etching solution comprising orthophosphoric acid for etching the layer 48. The second electric contacts 41 electrically connected to the vias 31 form connection pads of the infrared detection device 100 which are electrically connected to the electronic readout circuit 12, which justifies the preservation of the portions of the aluminum layer 47 at the second electric contacts 41 which will be used in wire cabling and in the spike contact used for testing the circuits. Preferentially, each of the second electric contacts 41 covers in a single piece all the vias 31 connected to a same second portion 21b of the metal line 21. The first electrical contacts 40 are each used for electrically connecting a via 30, to an electric terminal of an infrared heat detector. Each first electric contact 40 is formed with layers 44, 45, 46 and their combination with the via 30 on which it rests forms an electric connection connecting the readout circuit 12 to one of the terminals of one of the infrared heat detectors. "Ghost" metal patterns may be covered with electric contacts similar to the first electric contacts 40 in order to avoid diffusion of copper, while the portions of the optional metal lines may equally be covered with electric contacts similar to the first and to the second electric contacts 40 and 41.

The following steps of the method correspond to the making of infrared heat detectors notably, each including at least one absorbing element and at least one thermometric element, and each being connected to the readout circuit 12 notably via a first electric contact 40 and a via 30 (as well as through lower levels of electrical interconnections).

Figure 5A:
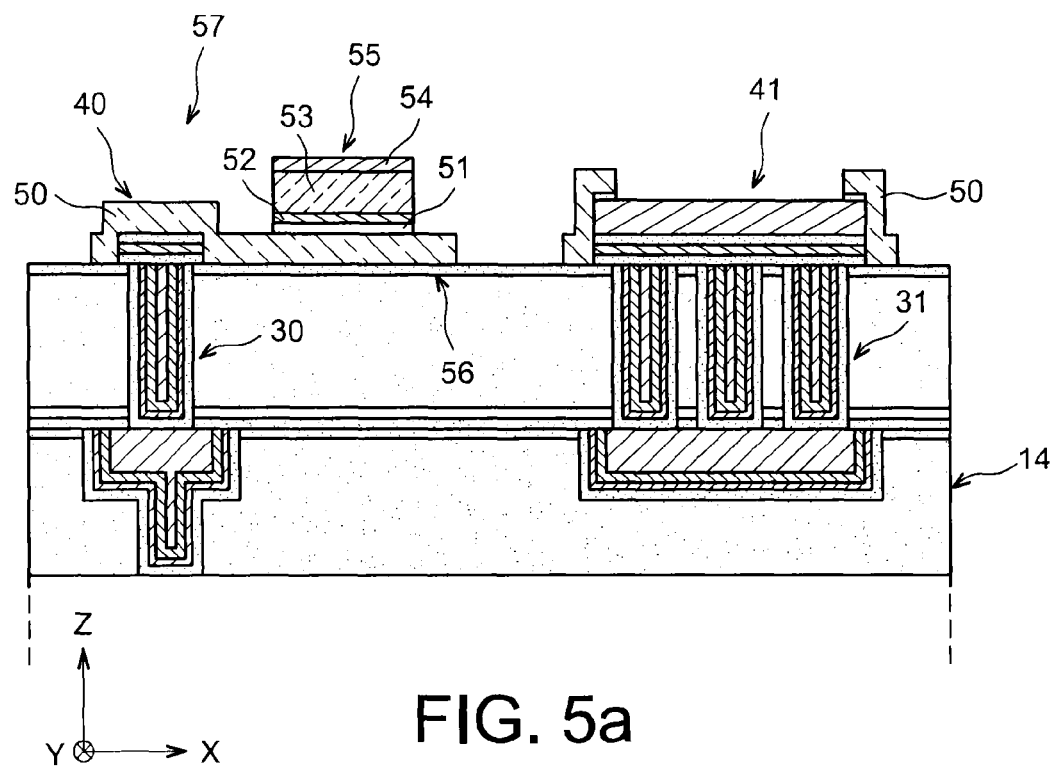
Figure 5B:
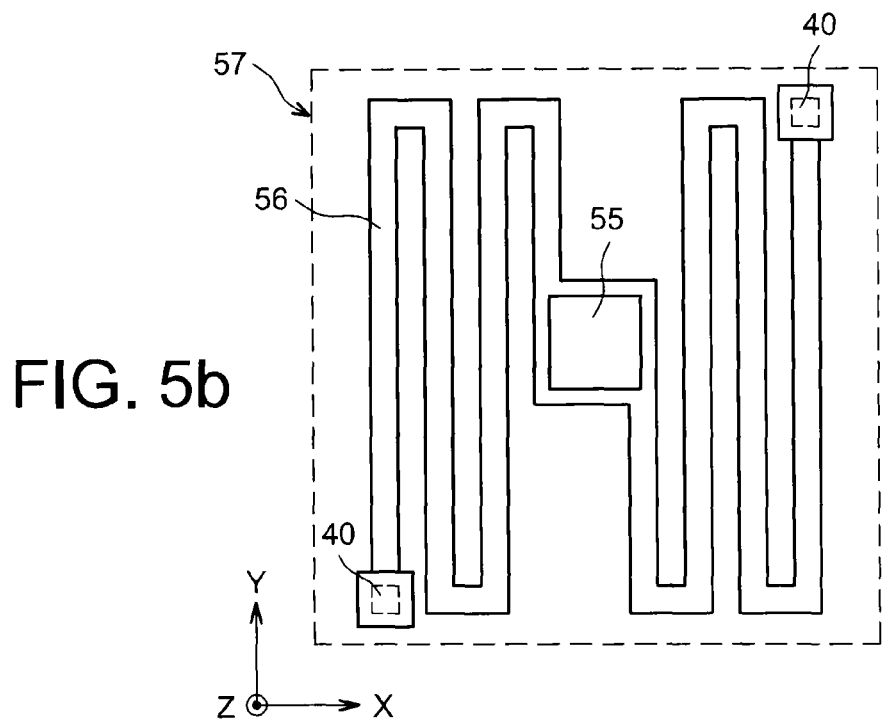

As illustrated in FIGS. 5a and 5b, a layer 50 of a material for which the resistivity substantially varies with the temperature is deposited on the elements made earlier. The layer 50 comprises for example amorphous silicon deposited by CVD, the resistivity of which is adjusted by doping during growth. The layer 50 is then covered with a dielectric layer 51, which is an electric insulator, for example comprising alumina ($Al_2O_3$). The dielectric layer 51 may also comprise aluminum nitride (AlN) also an electric insulator and having better heat conduction than alumina. This dielectric layer 51 is optional, its presence allowing a marginal improvement in the performances of infrared heat detectors. A first metal layer 52 preferentially comprising aluminum optionally alloyed with a few percent of copper or silicon, a dielectric layer 53 for example comprising amorphous silicon or on an amorphous silicon and germanium compound, and a second metal layer 54 preferentially comprising aluminum are then successively deposited.

An MIM (Metal-Insulator-Metal) pattern is made by photolithography and etching of the layers 54, 53 and 52, by sparing, for each infrared heat detector, at least one portion of each of these layers forming together at least one MIM structure 55 (each infrared heat detector may include several MIM structures) the geometry of which is adapted to the wavelength of the infrared radiation intended to be detected and depends on the refractive index of the material of the layer 53 for said wavelength. The MIM structure 55 forms a longitudinal cavity which allows excitation of plasmon resonances capable of absorbing infrared radiation for which the wavelength corresponds to the eigenfrequency of the cavity. Rules for dimensioning the MIM structure 55 are for example described in French patent application FR 11 56461. In the example described here, the MIM structure 55 is of a substantially square shape with a side equal to about 1.7 µm and for which the intermediate layer 53 comprising zinc sulfide with a refractive index equal to about 2.2, is provided with a thickness of about 180 nm, allowing detection of infrared radiation with a wavelength equal to about 8 µm. The etching defining the MIM structure 55 may be provided for either removing (like in the case in FIG. 5a) or not the portions of the layer 51 not covered by the MIM structure 55. In the latter case, the layer 51 is located on the upper face of the layer 50, the assembly formed by layers 50, 51 may then be considered as a single layer. Photolithography and etching of the layer 50 (or of the layers 50 and 51) define thermometric elements 56 each forming, with the absorbent element (towards the infrared radiation to be detected) formed by the MIM structure 55 associated with the thermometric element 56 and with at least one first electric contact 40 (two in the examples of FIGS. 5a and 5B) associated with the thermometric element 56, an infrared heat detector 57. Preferentially, portions of the layer 50 are preserved on the top of the <<ghost>> metal patterns and on the top of optional metal line portions.

FIG. 5b illustrates a top view of the infrared heat detector 57, comprising the MIM structure 55 substantially localized at the center of the detector, i.e. at the center of the pixel, in contact with the upper face of the thermometric element 56 made as a coil etched in the layer 50 and connected to the two first electric contacts 40. When the detector 57 receives infrared radiation, the energy of this infrared radiation is absorbed by the MIM structure 55 and transformed into heat which is transferred to the thermometric element 56. A temperature gradient is then established along the thermometric element 56 between a hot area in proximity to the MIM structure 55 and cold areas at the electric contacts 40, thermally shunted with the CMOS substrate via electrical connections provided by the vias 30 (the CMOS substrate corresponds to all the elements located under the vias 30 and 31). The electric resistance of the thermometric element 56 is modified therefrom with a sensitivity all the higher when one is closer to the MIM structure 55. The presence of the electrically insulating layer 51 between the thermometric element 56 and the first metal layer 52 of the MIM structure 55 is advantageous, without which the most sensitive portion of the thermometric element 56 located under the MIM structure 55 would be shunted by the strong electric conductivity of the lower face of the MIM structure 55.

The etching step defining the thermometric element 56 may also be used for removing the layer 50 on a part of the surface of the second electric contacts 41, as visible in FIG. 5a. This removal is advantageous if provision is not made for continuing the making of the heat detectors 57 with an additional process aiming at integrating a confinement of the heat detectors 57, securely with the substrate. It is therefore well adapted to the case when the detection device 100 is mounted in a sealed casing (in vacuo or under a controlled gas) or if the detection device 100 is not intended to operate under a confined atmosphere. It is possible to provide termination of this etching step by a so-called <<back sputtering>> operation aiming at also suppressing the titanium nitride layer 48 which covers the surface of the second electric contacts 41.

Figure 6:
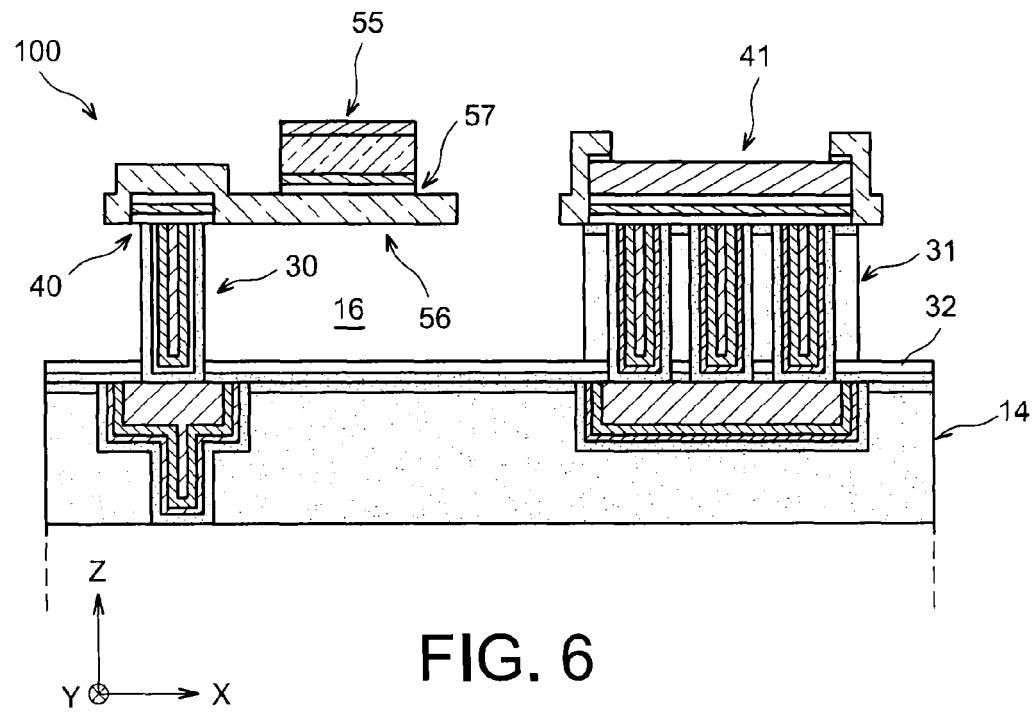

The detection device 100 may be completed by etching the layers 37 and 38 so that the thermometric elements 56 and the MIM structures 55 form suspended membranes (FIG. 6). The layers 37 and 38 are for example removed by chemical etching with hydrofluoric acid (HF) in a vapor phase. An HF vapor treatment is preferred here to chemical etching in a liquid phase which may lead to a collapse of the suspended structures of the infrared heat detectors 57 because of the surface tension of the liquid which would be exerted on them. Hydrofluoric acid in a vapor phase is known for perfectly removing non-doped silicon oxide such as the USG of the layer 37 and the $SiO_2$ of the layer 38. On the other hand, HF is inert towards the alumina layer 32 which therefore forms an efficient barrier for preventing propagation of the chemical etching towards the dielectric IMD layers of the lower levels of electrical interconnections.

Further, HF is inert towards the layers 50, 51, 52, 53, 54 present in the infrared heat detectors 57, respectively made of amorphous silicon, alumina, aluminum, amorphous alloy of silicon and germanium, and aluminum. As indicated in the description of the method, the electrically conducting vias 30 and 31 are also themselves made from materials like copper or tungsten which are not very sensitive to hydrofluoric acid and which may further be encapsulated by protective layers which are more resistant to HF, such as titanium nitride or an alloy of titanium, of tungsten or silicon carbide.

Portions of materials stemming from the layers 37 and 38 are retained around the vias 31 in order to improve the mechanical robustness of the second electric contacts 41. This further allows reduction in the required etching time, and therefore in the cost related to such etching. These portions are retained because the dimension of these vias along the X or Y axis, for example equal to about 100 μm is much greater than that along the Z axis, for example between 1 and 10 μm.

The thereby obtained infrared detection device 100 includes one or several infrared heat detectors 57 made so as to be suspended above the etching stop layer 32 and above the penultimate level of electrical interconnections 20. An empty space 16 surrounds each via 30, i.e. each via 30 is not in contact with dielectric material of the inter-metal dielectric layer 37 arranged between the penultimate and the last level of electrical interconnections. Each empty space 16 extends under each infrared heat detector 57 and thus forms an optical cavity of each infrared heat detector 57. In the infrared detection device 100, the infrared heat detector(s) 57 is(are) therefore made at the same level as the connection pad(s) 41 formed by the last level of electrical interconnections, i.e. the distance separating the etching stop layer 32 of an infrared heat detector 57 is substantially equal to the distance separating a connection pad 41 from this etching stop layer 32.

A method for making an infrared detection device 200 according to a second embodiment is now described, including infrared heat detectors 67 made as described in document U.S. Pat. No. 5,912,464. In this second embodiment, the steps described earlier in connection with FIGS. 1 to 4 are first of all carried out.

Figure 7A:
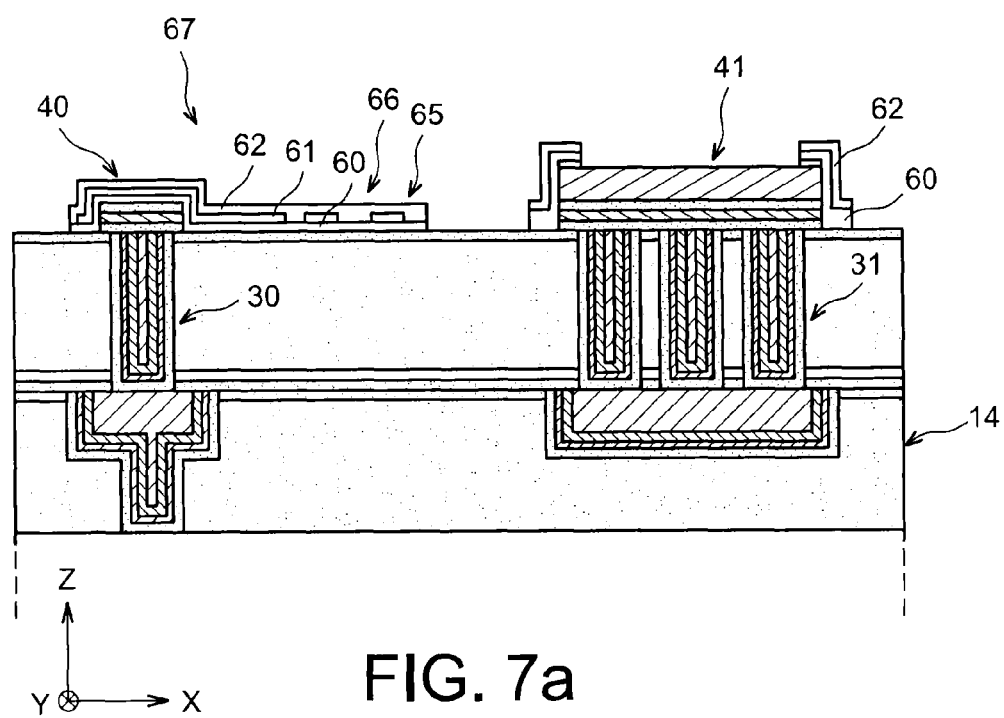
FIGS. 7a-8 illustrate a part of the steps of a method for making an infrared detection device according to a second embodiment.

As illustrated in FIG. 7a, a first layer 60 comprising a material for which the resistivity varies substantially with the temperature, for example similar to the one of the layer 50, is deposited. A resistive layer 61, for example a metal layer or comprising a doped semiconductor, for which the resistivity-thickness pair is suitable for optimizing absorption of infrared radiation by resistive coupling of the electrons of this layer, is deposited on the first layer 60. A photolithographic and etching step is carried out in order to fragment the resistive layer 61 into different portions 65 so as to make absorbing elements formed with remaining portions of the resistive layer 61 and thermometric elements 66 between said remaining portions, where the resistive layer 61 has been removed. A second layer 62 of a material sensitive to temperature, for example and preferentially similar to that of the first layer 60 is then deposited. Although an option, the second layer 62 gives the possibility of obtaining a structure of symmetrical layers which allows compensation of the mechanical stresses, which result from the bilayer effect between the layers 60 and 61, on the one hand, and total protection of the resistive layer 61 on the other hand, which is generally very thin, relatively to the chemical etching in an HF medium subsequently used for forming the suspended membranes of the infrared heat detectors 67. Each infrared heat detector 67 including thermometric elements 66, resistive elements 65 and one or several first electric contacts 40, is defined by photolithography and etching of the layers 60 and 62.

Figure 7B:
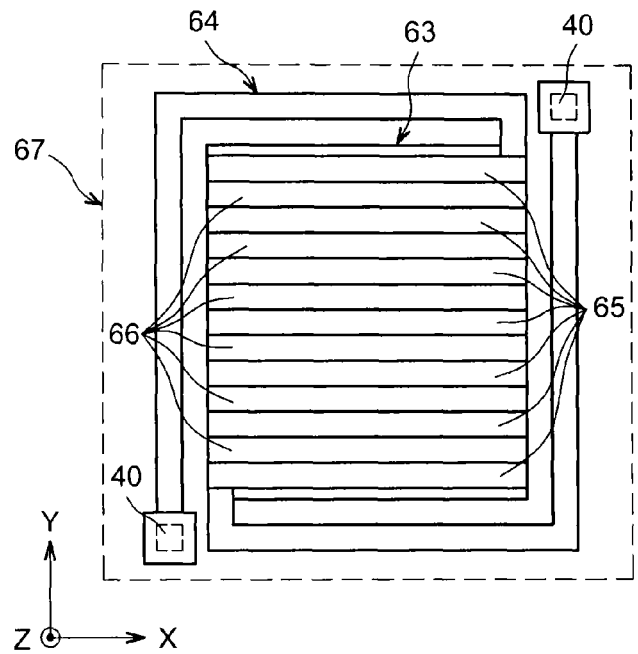

FIG. 7b shows a top view of an example of such a heat detector 67, including a central element 63 formed in the material sensitive to temperature and including the resistive elements 65 in the form of resistive strips, for example metal strips. The spaces between the resistive strips form an overall thermometric element formed with several thermometric units 66 connected in series through the intermediate resistive strips of lower resistance. Other forms are possible for forming the resistive elements 65, such as for example interdigitated combs including segments arranged in perpendicular directions for making the teeth and the back of the comb respectively. In this peripheral portion, the central element 63 is extended with reduced portions of sections 64 formed by portions of the stack of the layers 60, 61 and 62 and each connected through their end to a first electric contact 40. The infrared energy is absorbed by the element 65 and transformed into heat which is transmitted to the thermometric elements 66. A temperature gradient is then established between the central element 63 which heats up and the end of the portions with reduced sections 64 thermally shunted with the substrate via the electric connections formed by the vias 30. The electric resistance of the thermometric patterns 66 is modified therefrom and its measurement reflects the amplitude of the infrared signal captured by the elements 65.

Figure 8:
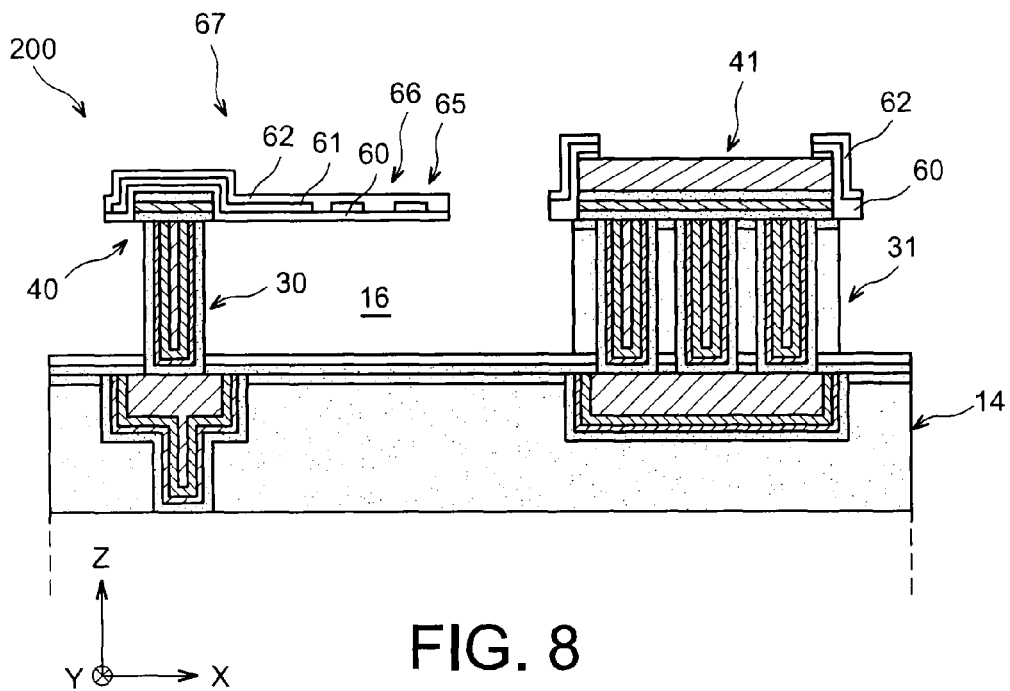

The continuation of the method for processing the second electric contacts 41 and for obtaining suspended membranes is identical with the one already described for the detection device 100 according to the first embodiment, and notably corresponds to the etching of the layers 37 and 38 such that the heat detectors 67 include suspended membranes. The sectional view of FIG. 8 shows that the infrared heat detector 67 is notably formed with a fragmented resistive film 61, surrounded by infrared-transparent dielectric layers 60 and 62, the whole being suspended in a dielectric medium. According to Maxwell's laws, the absorption of a continuous resistive film separating two infinite dielectric half-spaces is equal to 50% regardless of the wavelength, if the ratio of the resistivity ρ on the thickness e of the resistive layer 61 is close to 60·π, i.e. 188Ω, and if it is assumed that the refractive index and the extinction coefficient of the resistive layer 61 are equal, which is generally the case in the domain of infrared wavelengths. This resistance of 188Ω may be obtained by making the deposited TiN-based resistive layer 61 by sputtering, with a resistivity equal to about 150 µΩ·cm, with a thickness equal to about 16 nm and fragmented in such a way that its coverage level (surface area of the resistive element 65 relatively to the total surface of the central element 63, in the plane (X;Y)) is about 50% for obtaining an apparent resistivity of 300 µΩ·cm. As an example, such a film of titanium nitride with a thickness equal to 16 nm and with resistivity equal to 150 µΩ·cm, fragmented in the form of strips with an equal width of 2.5 µm spaced apart by 2.5 µm up to 4 µm strips spaced apart by 4 µm, is suitable for detecting infrared radiation with a wavelength between about 8 µm and 12 µm.

As for the infrared detection device 100, the thereby obtained infrared detection device 200 includes one or several infrared heat detectors 67 made suspended above the etching stop layer 32 and above the penultimate level of electrical interconnections 20. An empty space 16 surrounds each via 30, i.e. each via 30 is not in contact with dielectric material of the inter-metal dielectric layer 37 located between the penultimate level and the last level of electrical interconnections. Each empty space 16 extends under each infrared heat detector 67 and thus forms an optical cavity of each infrared heat detector 67. Further, the infrared heat detector(s) 67 is(are) made at the same level as the connection pad(s) 41 formed by the last level of electrical interconnections, i.e. the distance separating the etching stop layer 32 from an infrared heat detector 67 is substantially equal to the distance separating a connection pad 41 from this etching stop layer 32.

Figure 9:
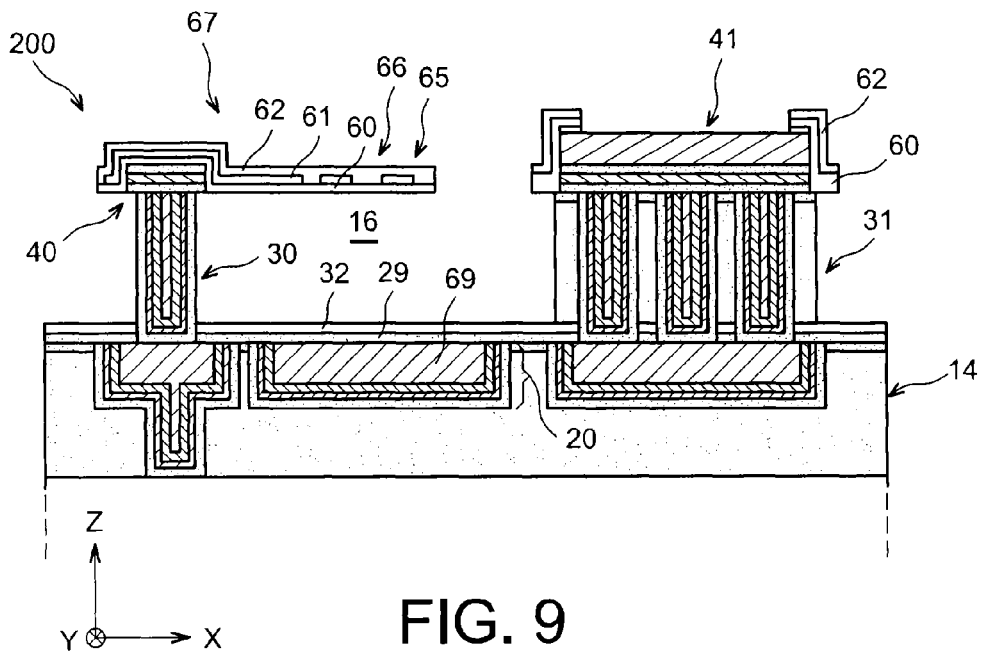
FIGS. 9 to 19 illustrate steps of methods for making an infrared detection device according to alternatives of the first and of the second embodiments.

According to a first alternative of the second embodiment, the absorption of the detection device 200 may be improved beyond 50% by providing coupling of a reflecting element 69 arranged facing and under each of the heat detectors 67, with a surface area substantially identical to that of the heat detector 67 and spaced from the detector by a distance equal to one quarter of the wavelength intended to be measured. FIG. 9 illustrates such an alternative wherein a reflecting element 69 is made by means of a portion of a metal line 21 of the penultimate interconnection level 20.

Although FIG. 9 relates to copper damascene back-end technology, it is possible to make, with the same advantage of improving absorption, the reflecting element 69 in an aluminum back-end technology, given that copper and aluminum have high reflection properties and close values in the infrared domain. The sectional view of FIG. 9 shows that the infrared heat detector 67 is formed, from bottom to top, starting with the penultimate interconnection level 20 of the CMOS substrate, with a metal reflector 69 formed in the interconnection level 20, with two dielectric layers 29, 32 of small thickness, with the empty space 16 forming an air space 16 with a thickness preferentially between about 2 µm and 2.5 µm by adjusting the thickness of the sacrificial layer 37, with a stack of layers comprising at least one fragmented resistive layer 61, the other dielectric layers 60, 62 being transparent to infrared.

The reflector 69, the air space 16 and the fragmented semi-absorbent resistive layer 61 form a quarter-wavelength interferential cavity which has a resonance peak for a wavelength equal to 4 times the thickness of the air space 16, in other words 10 µm and therefore well adapted to thermal imaging. Under these conditions and according to Maxwell's laws, this cavity may be provided for obtaining an absorption close to 100% in the vicinity of a wavelength of 10 µm if the ρ/e ratio of the resistivity over the thickness of the resistive layer 61 is close to 120Ω, i.e. 377Ω. This resistance may be obtained by making the resistive layer 61 with titanium nitride deposited by sputtering, with a resistivity equal to about 150 µΩ·cm, with a thickness equal to 8 nm and fragmented so that its filling level (surface area of the resistive element 65 relatively to the total surface area of the central element 63 in the plane (X;Y)) is of about 50% in order to obtain an apparent resistivity of 300 µΩ·cm. The fragmentation of the resistive layer 61 should also meet drawing rules such that the pattern of the fragmented elements is repeated according to a pitch typically between one and a half times the wavelength of interest for obtaining an average absorption of more than 90%. Strips with a width equal to about 2.5 µm spaced apart by about 2.5 µm up to strips of about 4 µm spaced apart by about 4 µm are suitable for detecting radiation between about 8 µm and 12 µm.

This first alternative embodiment coupling reflector elements formed in the level of interconnection 20 of the CMOS substrate with heat detectors may also be applied to the first embodiment described earlier.

Figure 10:
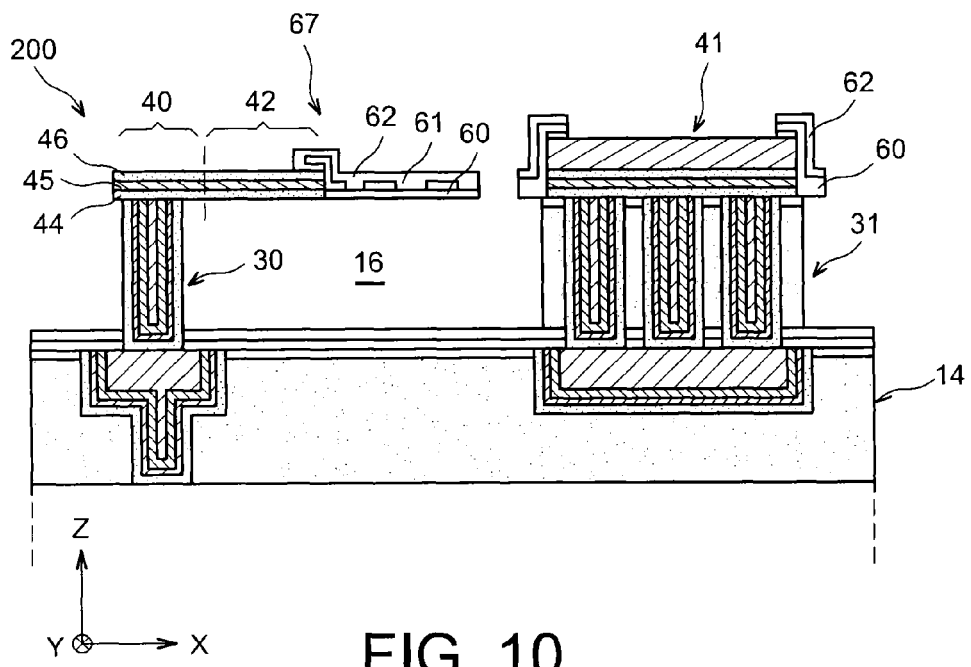

FIG. 10 illustrates the detection device 200 obtained according to a second alternative of the second embodiment, wherein an extension 42 of the first electric contacts 40 is achieved. The extension 42 of the first electric contact 40 formed from the layer 44, 45 and 46 also forming the first electric contact 40, is used both as an electric connection and as thermal insulation between the first electric contact 40 and the thermometric element of the heat detector 67 which is electrically connected to the via 30 through the first electric contact 40 and the extension 42. The extension 42 is advantageously provided with an elongated shape factor so as to reproduce the element with reduced section 64 described earlier. According to this arrangement, the thereby formed element of reduced section is without any layers 60, 61 and 62 to the benefit of the layers 44, 45 and 46, which allows significant reduction in its section since the layers 60 and 62 of the material sensitive to temperature are generally provided thick for improving the signal-to-noise ratio of the thermometric element.

This second alternative embodiment in which an extension 42 of the first electric contacts 40 is made, may also be applied to the first embodiment described earlier.

The embodiments and alternatives described earlier are advantageous since three photolithography steps are sufficient for building infrared heat detectors in the form of microbolometers on a CMOS substrate at the last level of electrical interconnections and in which electric connections are provided, at least in the penultimate level of electrical interconnections, for connecting the terminals of the heat detectors to the inputs of the readout circuit 12 formed in the CMOS substrate. A very advantageous manufacturing cost results from this. The following embodiments and alternatives give the possibility of improving the detection performances of the detection device, in return for a larger number of photolithography steps.

Figure 11:
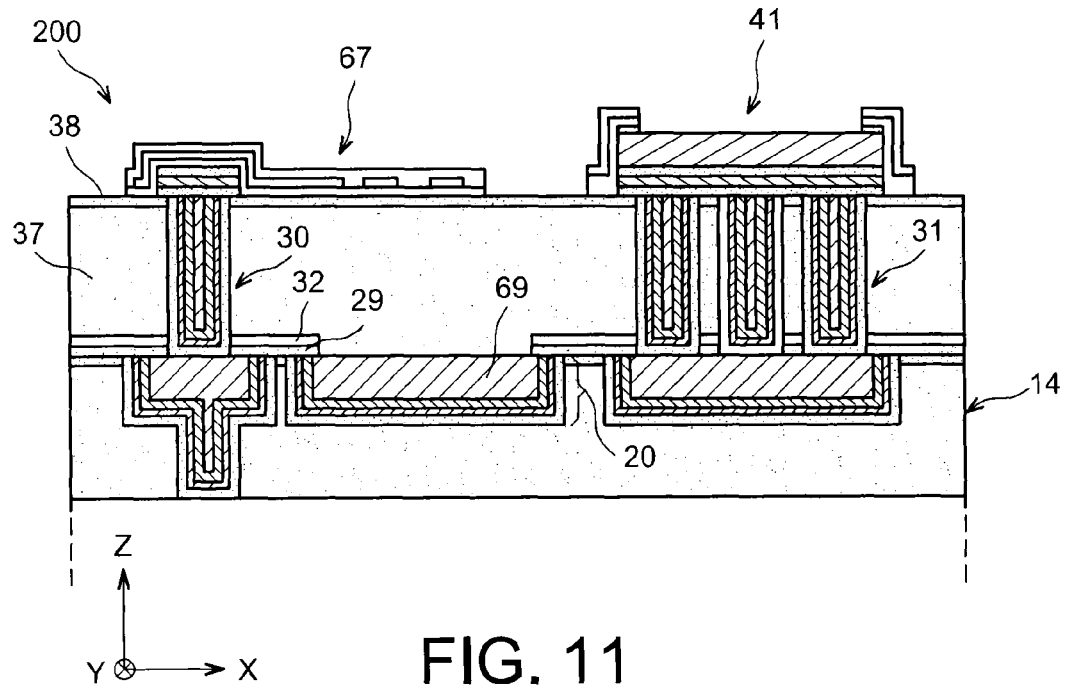

FIG. 11 illustrates the alternative described earlier in connection with FIG. 9, in which an additional level of photolithography is provided for defining and opening by etching windows in the layers 29, 32 with the purpose of clearing the upper face of the reflector 69 of all dielectric surface layers which may absorb the infrared energy and accordingly degrade the optical quality of the quarter-wave interferential cavity formed between the heat detector 67 and the reflector 69. This photolithography and etching operation occurs between the step for depositing the etching stop layer 32 and the step for depositing the sacrificial layer 37. This alternative advantageously applies to the case when a heat detector is provided associated with a quarter-wave cavity and a reflector.

It is also possible that these photolithography and etching steps are carried out for only removing the portion of the etching stop layer 32 at the reflector 69 and not the portion of the dielectric layer 29 arranged facing the reflector 69 forming a diffusion barrier to copper notably during the heat treatments which accompany the continuation of the method. In this case, the portion of the dielectric layer 29 may be removed from the surface area of the reflector 69 during a subsequent step carried out just after the operation for removing the layers 37, 38 by an acid attack in a HF vapor medium, a step beyond which heat treatments are moderate, typically less than 200° C. Hydrofluoric acid in a vapor phase is known for perfectly removing silicon oxide such as the USG of the layer 37 and the silicon dioxide of the layer 38. On the other hand, it generates solid nitride residues when it is in contact with a silicon nitride such as that of the layer 29. By sufficiently extending its exposure to HF vapors, it is possible to transform the material of the dielectric layer 29 over the whole of its thickness, into nitride residues localized in the areas where the etching stop layer 32 was etched beforehand. Outside these opening areas and an extension of small extent under the layer 32 in the periphery of these opening areas, the silicon nitride of the layer 29 is retained as is by the protection provided by the layer 32. The nitride residues are then advantageously removed by a sublimation heat treatment, for example of about 30 minutes with a temperature equal to about 180° C. under a pressure of about 10 Pascals which is preferred for avoiding any transition through a liquid phase which may cause collapse of the suspended structures because of the surface tensions which would develop therein.

Figure 12:
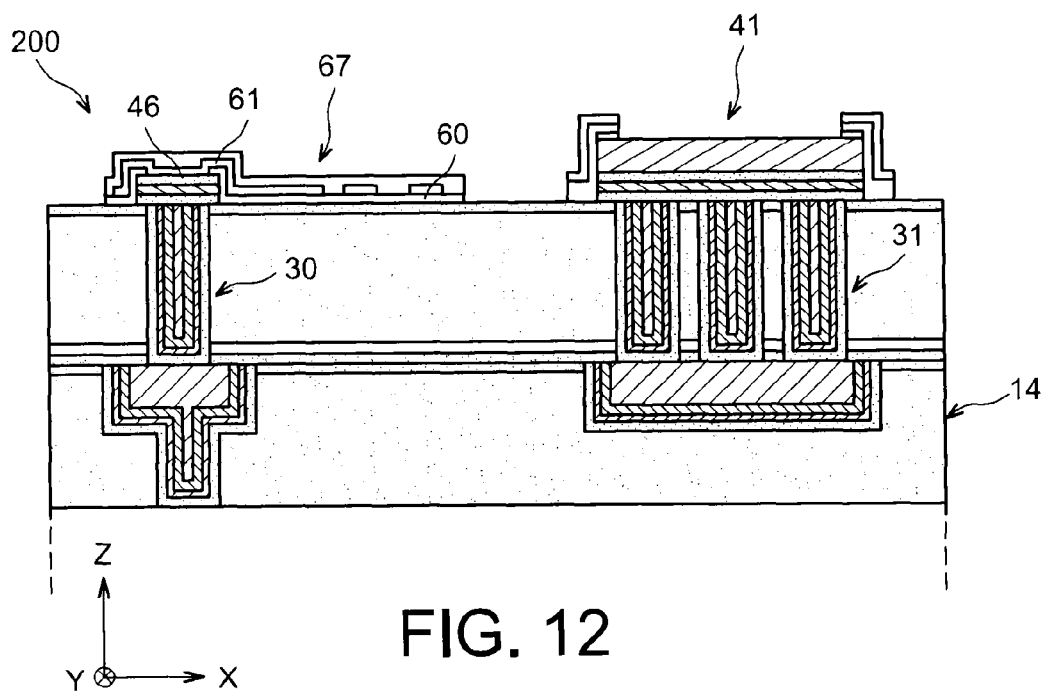

According to another alternative illustrated in FIG. 12 and preferentially applied to the detection device 200 according to the second embodiment, it is possible to provide an additional photolithography level giving the possibility of defining, by local etching of the layer 60 of material sensitive to temperature, an additional electric contact area between the resistive layer 61 and the upper layer 46 of one of the first electric contacts 40. Such an electric contact area gives the possibility of advantageously reducing the resistance for accessing the heat detector 67 and of accordingly increasing its thermal sensitivity. This additional photolithography step is inserted between the deposition of the layer 60 and the deposition of the resistive layer 61. The electric contact may be formed by the extension of the layer 61 in the opening made by the etching of the layer 60 up to contact with the layer 46, as illustrated in FIG. 11. Another alternative (not shown) may consist of forming an additional electric contact area by using an additional metal layer deposited after the resistive layer 61 and defined by photolithography so as to cover the opening made in the layer 60, the additional metal layer being etched outside this covering area in order to limit its size to the single surface required for good electric contact resumption between the layers 46 and 61. The nature and the thickness of the additional metal layer are selected so as to have a continuous section between the top and the bottom of the opening made in the layer 60.

Figure 19:
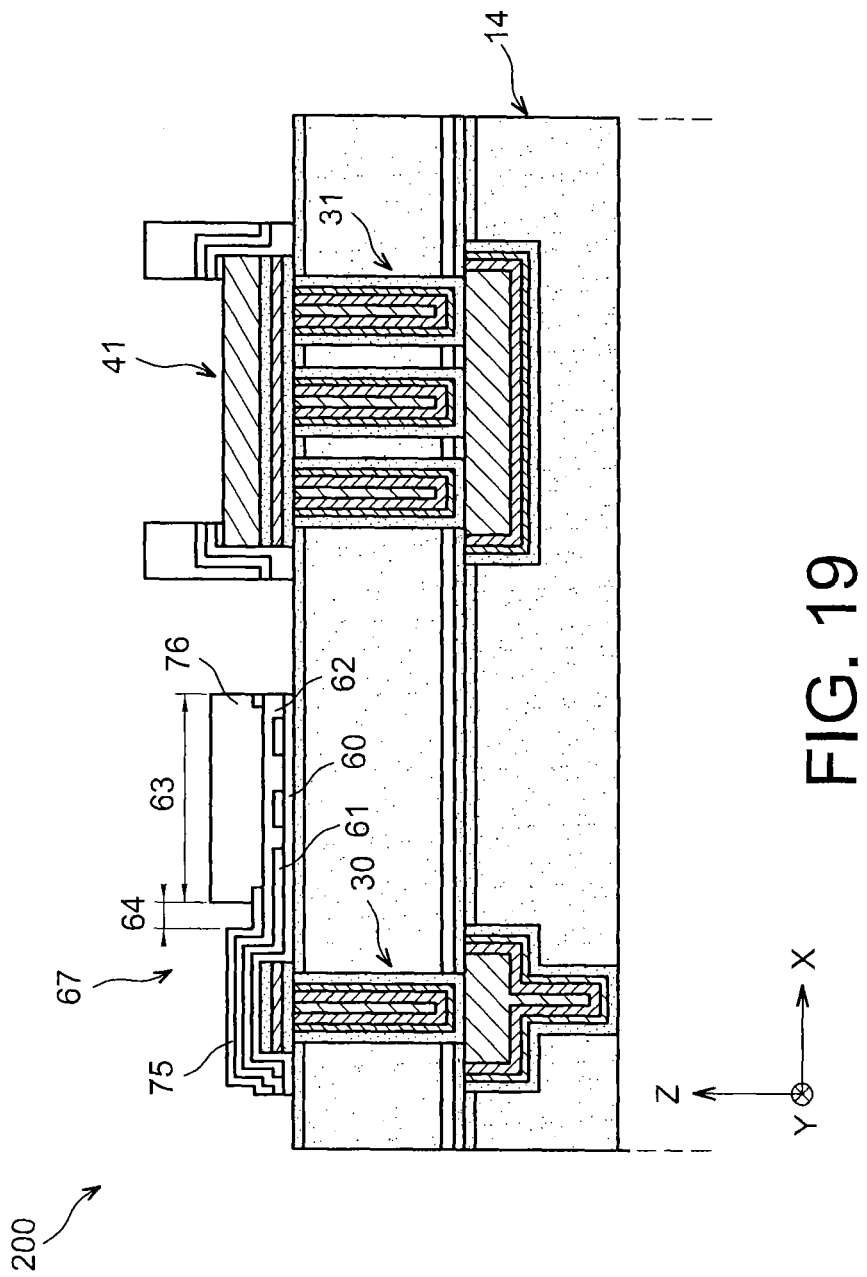

According to another alternative illustrated in FIG. 19 and preferentially applied to the detection device 200 according to the second embodiment, it is further possible to provide between the step for depositing the second layer 62 of a material sensitive to temperature and the step for defining infrared heat detectors 67 by etching of the layers 60 and 62:
a step for depositing a temporary layer 75, which may be suppressed by exposure to HF vapors, for example comprising silicon oxide,
a photolithography and etching step provided for removing a portion of the temporary layer 75 in an internal area and slightly set back from the central element 63,
a step for depositing a third layer 76 of a material sensitive to temperature, preferentially of the same nature as 60 and 62, but with a substantially larger thickness,
a photolithography and etching step for removing a portion of the third layer 76 of a material sensitive to temperature by sparing an area corresponding to the central element 63. The temporary layer 75 is advantageously used as a stop layer for the step for etching the third layer 76 of the material sensitive to temperature.

According to this alternative, the infrared heat detector 67 is formed with a central element 63 comprising, in addition to resistive elements 65 for example in the form of metal strips, thermometric elements 66 in the form of three layers 60, 62, 76 of a material sensitive to temperature, the total thickness of which is substantially greater than the sum of the thicknesses of 60 and 62. The result is a decrease in the electrical noise of the thermometric elements 66 according to a law which is inversely proportional to the thickness of the thermometric element 66. The temporary layer 75 is automatically suppressed during a subsequent step for etching at least one portion of the first sacrificial layer, so that the infrared heat detector 67 is also formed with portions with reduced sections 64 in the form of three layers 60, 61, 62 stacked on each other, the thickness of which is substantially less than the thickness of the central element 63. The result is a decrease in heat conductance of the element 64 and consequently better heat insulation of the central element 63 and a gain in sensitivity of the infrared heat detector 67.

Other forms of heat detectors may be suitable insofar that none of the visible faces of these detectors include any materials which may be attacked by etching carried out for removing the layers 37 and 38 such as chemical etching in an HF medium. Such detectors for example include silicon, germanium, aluminum (either alloyed or not with copper and/or with silicon), tungsten, titanium nitride, a titanium alloy such as TiAl or TiW, molybdenum silicide, copper, gold, nickel, chromium, ruthenium, copper-tin alloy alumina, silicon carbide, amorphous carbon, aluminum trifluoride, or further aluminum nitride.

For all the embodiments and alternatives described earlier, it is possible to produce a confinement, or encapsulation of the heat detectors, such as for example described in document U.S. Pat. No. 6,753,526, secured with the substrate on which these elements are made, as described below.

Figure 13:
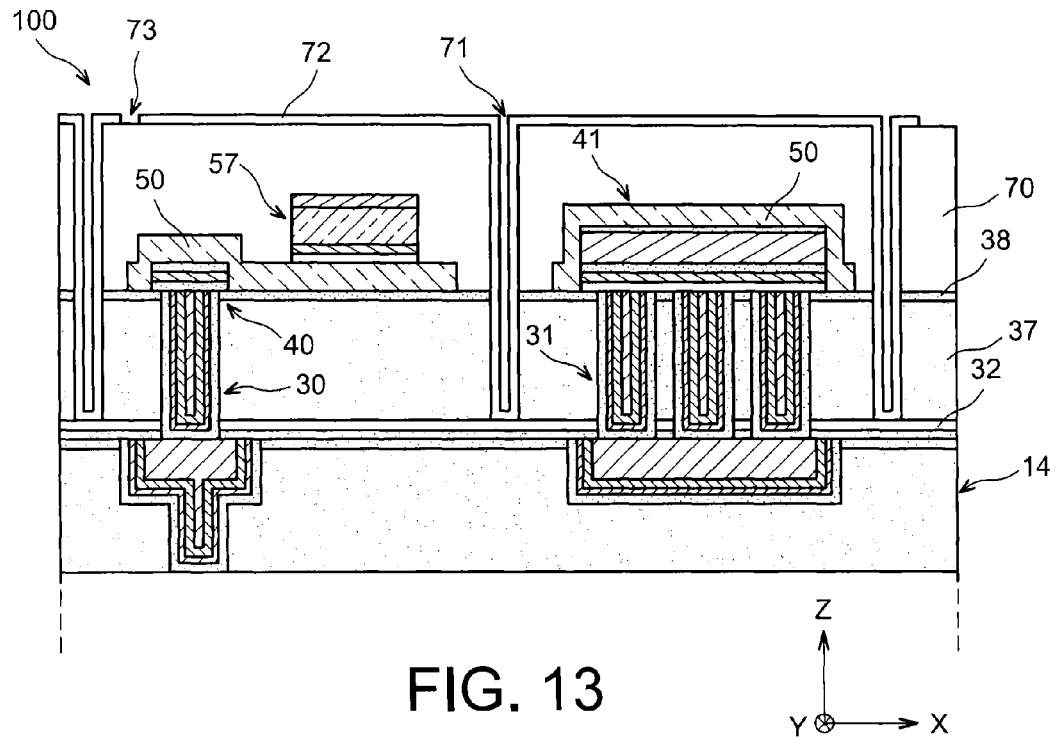

According to a first confinement approach in which the encapsulation is achieved by using the deposition of thin layers, the step for etching the layer 50 (or the layers 60 and 62 in the case of the second embodiment) defining and separating the heat detectors from each other, is carried out in order to preferentially spare the portions of this layer 50 covering the second electric contacts 41. As illustrated in FIG. 13, a second sacrificial dielectric layer 70, for example and preferentially of the same nature as the first sacrificial layer 37 (USG for example), is deposited above the elements made earlier, and planarized. The thickness of this second sacrificial layer 70 is for example between about 1 µm and 3 µm. Trenches 71 are defined by photolithography and etched in the layers 70, 38 and 37 for example opening onto the etching stop layer 32 or optionally onto layers below the layer 32. The trenches 71 are defined such that they form closed perimeters when they surround one or several heat detectors. Outside the area where the heat detectors are made, trenches may be provided but not necessarily, their perimeter may be open or closed. In the example of FIG. 13, trenches 71 are also provided on either side of a second electric contact 41.

An encapsulation layer 72 transparent to infrared is then deposited according to a suitable deposition technique in order to obtain proper covering of the vertical flanks of the trenches 71. This may be for example an amorphous silicon layer made by CVD or by IPVD, with a thickness typically between about 400 nm and 1,200 nm when it is measured on a planar surface. The deposition of the encapsulation layer 72 on a surface structured by trenches 71, the perimeter of which is closed, leads to the formation of hermetically sealed capsules, made with the material of the encapsulation layer 72 and forming, in contact with the substrate, spaces in which the heat detectors are confined. As illustrated in FIG. 13, the deposition of the encapsulation layer 72 may also form capsules outside the area of the heat detectors, for example around second electric contacts 41. Orifices 73, or apertures, are then made by photolithography and etching in the encapsulation layer 72. Each orifice 73 may be of a square, rectangular, circular or oblong shape, its small dimension being typically between about 200 nm and 600 nm. At least one orifice 73 per closed perimeter surrounding at least one heat detector is provided. More advantageously, the orifices 73 may be made through the encapsulation layer 72 with a repetition pitch of about 10 μm. Preferentially, the capsule surrounding the second electric contacts are without any orifice.

Figure 14:
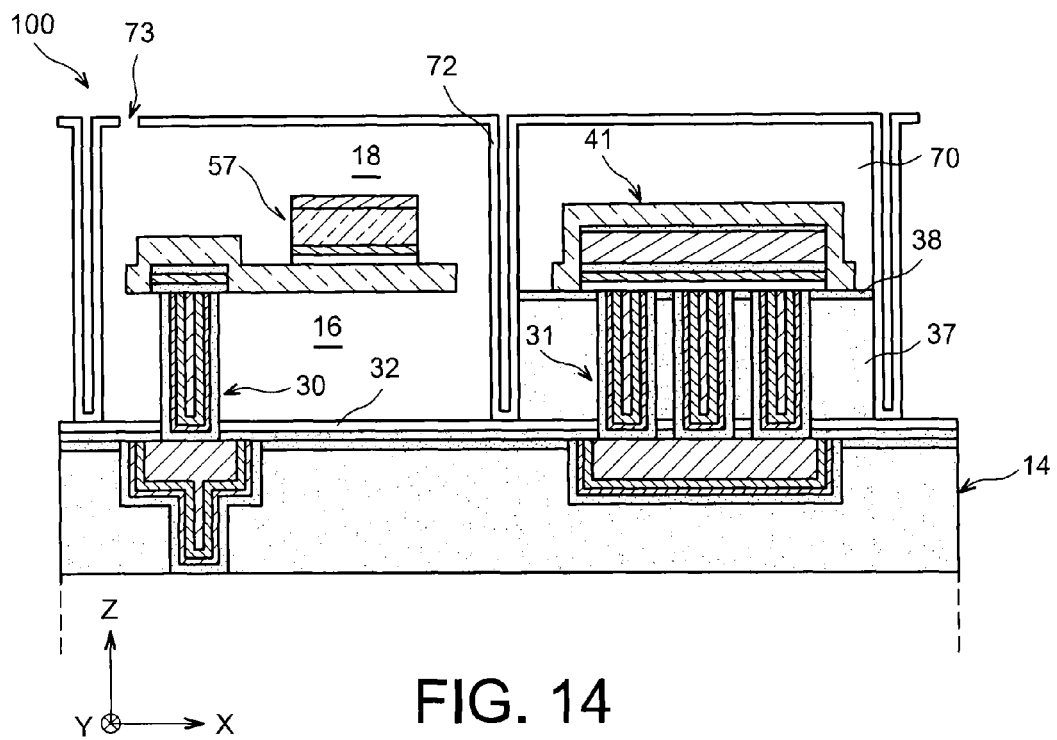

As illustrated in FIG. 14, the sacrificial layers 37, 70 and the layer 38 are removed, by chemical etching with HF vapor, forming cavities 18 containing the heat detectors 57, 67 as well as the empty spaces 16, via the orifices 73. The reactive agents and the products of the chemical reaction all in gaseous form are respectively introduced and discharged via orifices 73. The propagation of the chemical etching with HF is vertically controlled by the presence of the barrier layer 32 and by the material of the encapsulation layer 72 in the other directions. By providing an orifice 73 at least every 10 μm, the totality of the layers 37, 38, 70 may be removed within about one hour.

Figure 15:
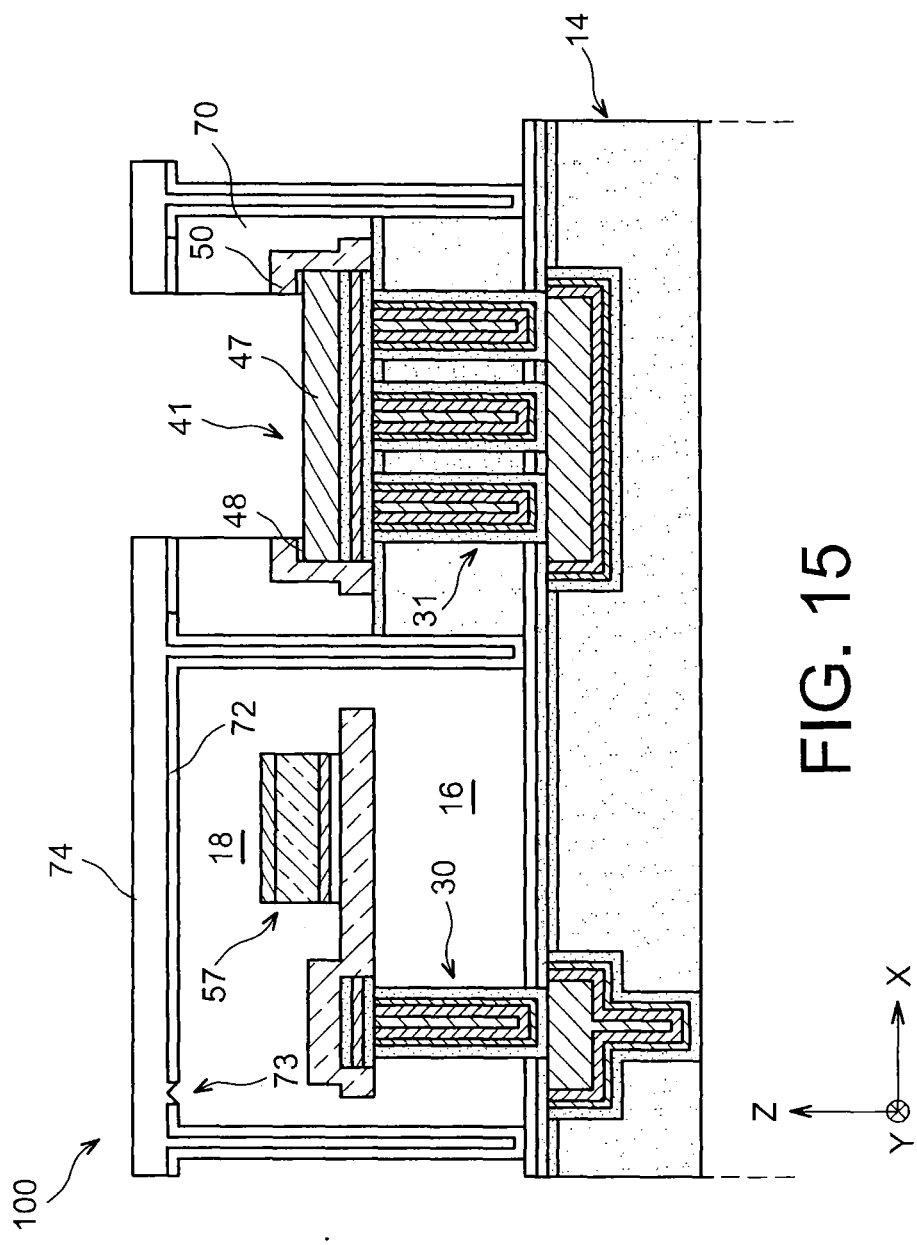

As illustrated in FIG. 15, a plugging layer 74 transparent to infrared is deposited, fulfilling a function for closing the orifices 73 on the one hand in order to obtain hermetically sealed cavities around heat detectors 57, 67 and an antireflective function for promoting transmission of the infrared radiation through the encapsulation layer 72 on the other hand, towards the heat detectors 57, 67. The plugging layer 74 for example includes an alternation of germanium and zinc sulfide deposits, thereby forming an anti-reflective layer of good quality for infrared wavelengths between about 8 μm and 12 μM. The plugging layer 74 may be made by a technique for depositing thin layers in vacuo such as for example evaporation in vacuo of a source heated by an electron beam (EBPVD). At this stage of the method, infrared radiation heat detectors are therefore available, contained inside cavities 18 hermetically sealed by layers transparent to infrared and at reduced atmospheric pressure. These heat detectors 57, 67 are therefore functional as they are without it being necessary to integrate them into a casing in vacuo.

The result of this is an advantageous manufacturing cost. A last photolithography step gives the possibility of opening the connection pads of the detection device 100, formed by the second electric contacts 41 by localized etching of the layers 74, 72, 70, optionally of the layers 48 and 50 if the latter have been spared on the surface of the second electric contacts 41 in a previous step, in order to open onto the surface of the layer 47 of these second electric contacts 41.

The hermetic confinement or encapsulation of the heat detectors 57, 67 may also be achieved as for example described in document U.S. Pat. No. 5,895,233. This confinement method is described below in connection with the detection device 200 according to the second embodiment. However such a confinement may be achieved with the detection device 100 according to the first embodiment.

According to this second confinement approach in which the encapsulation is achieved by transfer of a second substrate, a second substrate 90 is provided, selected in a material transparent to infrared, preferentially made of silicon, which is sealed with the first substrate 10 on which are formed the heat detectors 57, 67 connected to the CMOS readout circuit 12, the first and the second substrates being spaced apart from each other so as to form a hermetically sealed cavity around the heat detectors.

Figure 16:
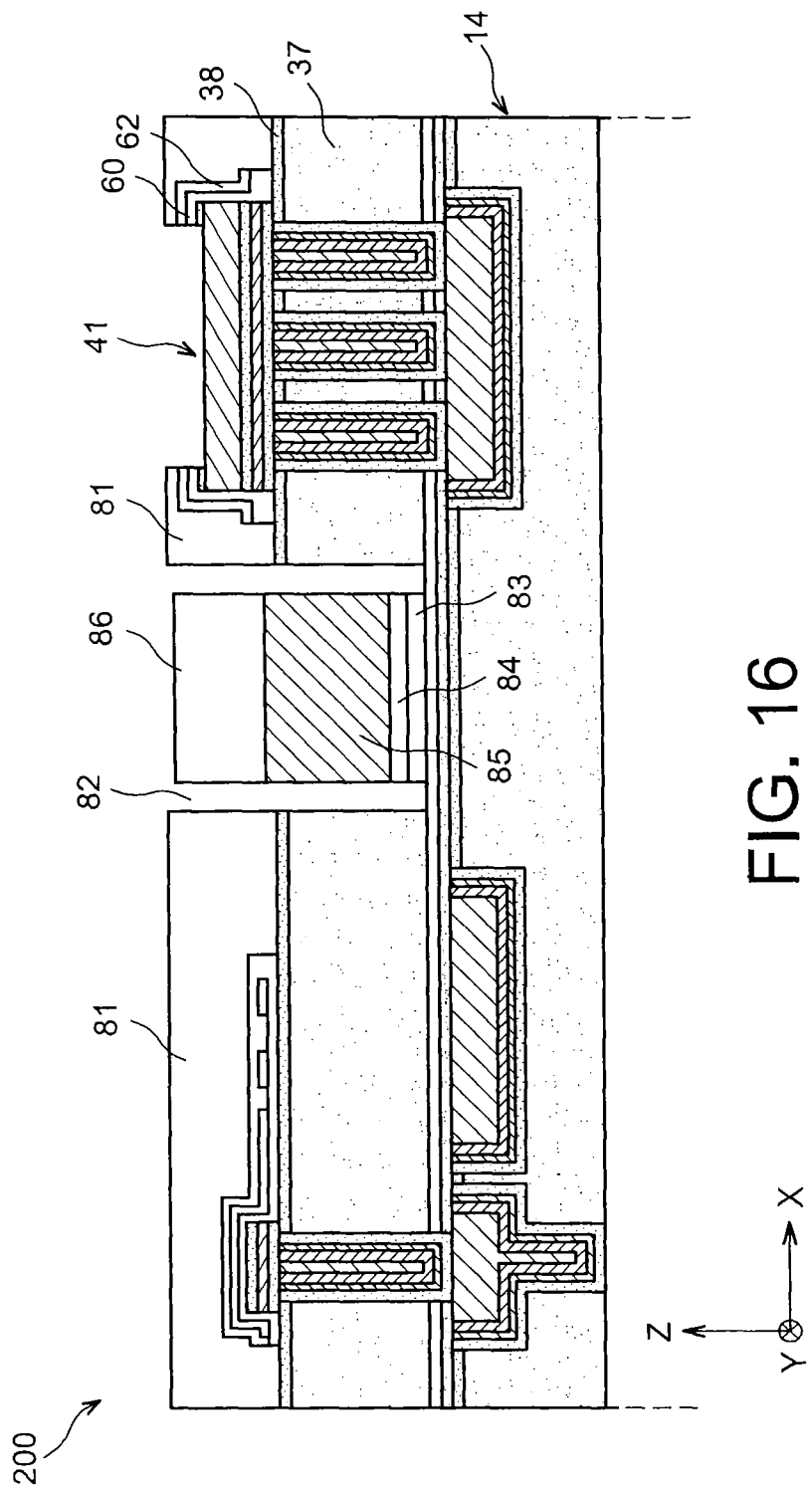

This confinement is carried out from the structure which is in the condition illustrated in FIG. 7a in which a step for etching the layers 60 and 62 defines and separates the heat detectors from each other and preferentially opens the layers 60, 62 on the surface of the second electric contacts 41. At this stage of the making, and as illustrated in FIG. 16, a protective dielectric layer 81, for example and preferentially of the same nature as the sacrificial layer 37 (USG for example) is deposited and then planarized. The thickness of the protective dielectric layer 81 is typically between about 0.5 μm and 2 μm. A trench area 82, forming a closed perimeter around one or several heat detectors intended to be encapsulated, is defined by photolithography, and then etched through the layers 81, 38 and 37. It is then proceeded with the deposition of a layer 83 used as an adhesion layer and as a diffusion barrier to copper, and then with the deposition of a copper layer 84 which is used both as a cathode and as a germination layer for electrolytic growth of a copper layer 85 followed by an electrolytic tin layer 86. The layer 83 may be provided with a titanium and tungsten alloy (TiW) deposited by cathodic sputtering. The extent of the layers 85, 86 is limited to the surface of the trenches 82, for example by extending a photoresist specifically designed for localizing the electrolytic growth reactions, on the surface of the first substrate already covered with the layer 84. The photoresist is then reopened at the vertical of the trench 82 in order to expose the germination layer 84 where electrolytic growth may form. Cleaning steps then give the possibility of removing the photoresist and the metal layers 83, 84 from the flat surface of the layer 81 (chemical cleaning and mecano-chemical polishing).

Figure 17:
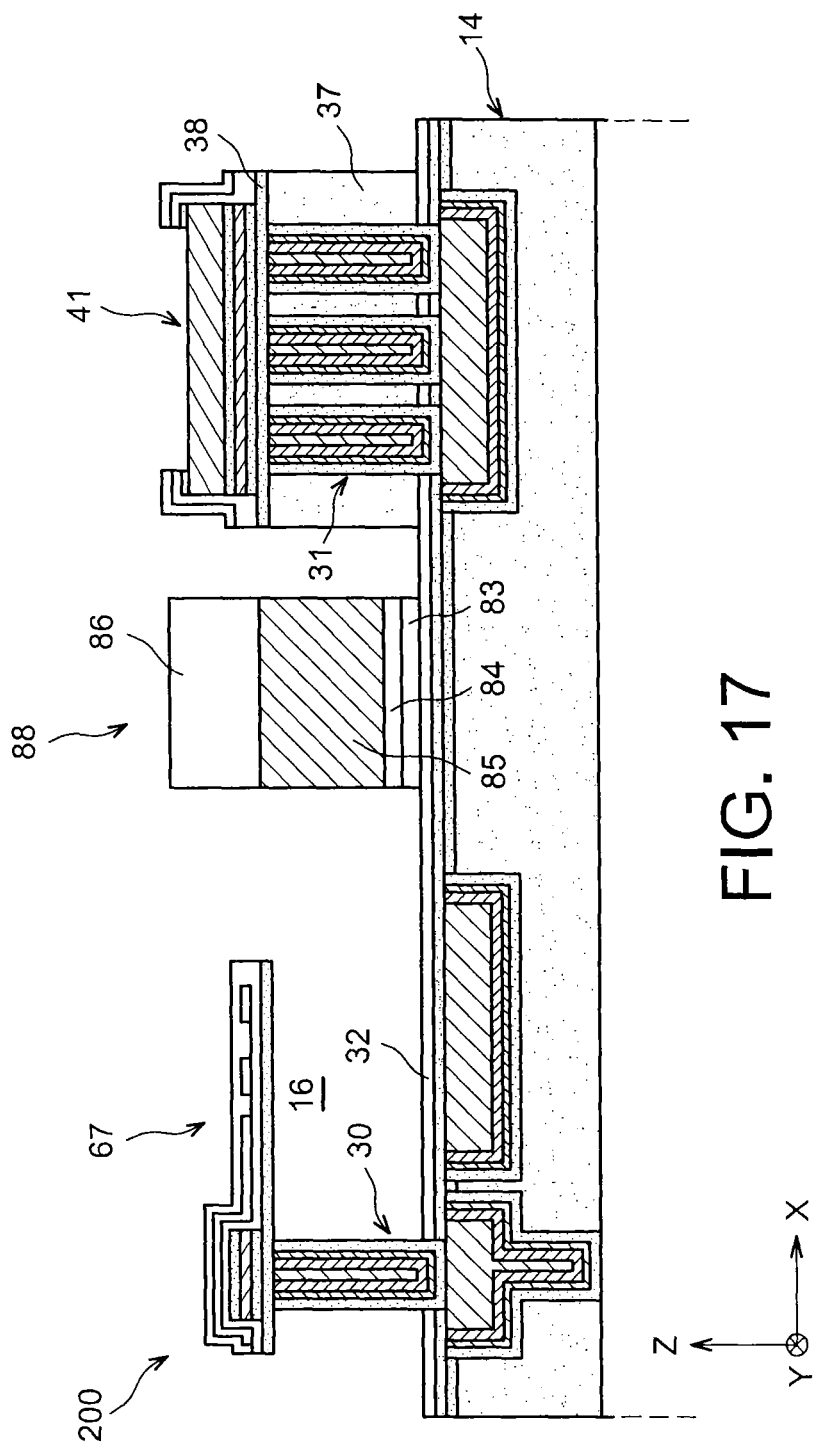

During the next step illustrated by FIG. 17, the sacrificial layers 37, 81 and the dielectric layer 38 are removed by acid attack in an HF vapor medium. The vertical propagation of the chemical etching is controlled by the presence of the etching stop layer 32 which protects the IMD layers of the lower levels of electrical interconnections. The propagation of the chemical etching under the connection pads is relatively not very extended considering their size (with a side from 100 μm to 150 μm) much greater than the thickness of the layer 37 (from 1 μm to 5 μm). The layers 83, 84, 85, 86 respectively made with TiW, copper, electrolytic copper, tin, resist to hydrofluoric acid and therefore remain in place.

The first substrate 10 then includes at the surface, connection pads formed by the second electric contacts 41 and membranes suspended of the heat detectors 67 surrounded by metal beads 88 provided for being sealed with other metal beads 98 made on a second substrate 90.

Figure 18:
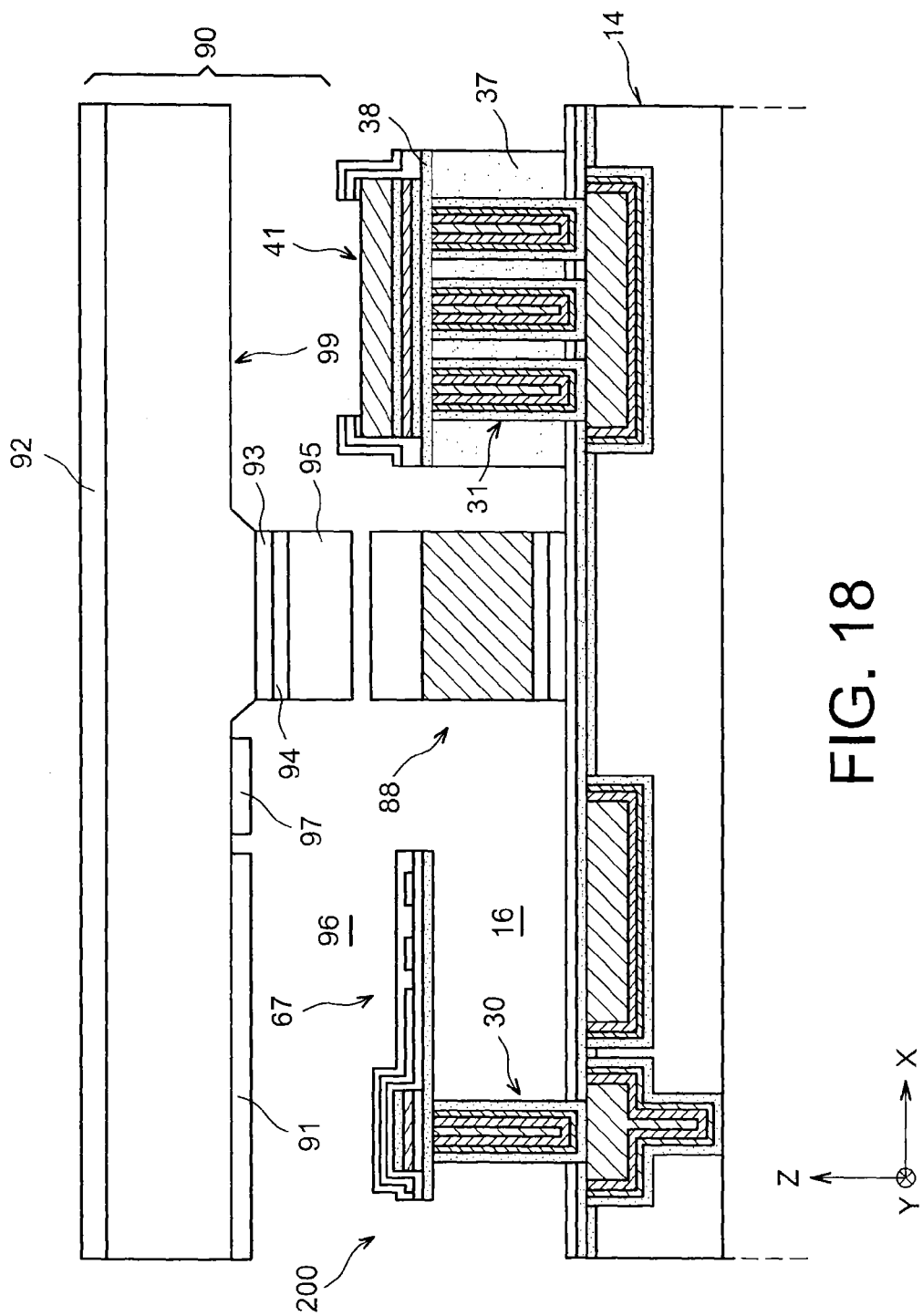

FIG. 18 shows the second substrate 90, preferentially silicon-based, intended to be secured to the first substrate 10. On a first face of the substrate 90 are provided:
- a metal bead 98 including a stack of three metal layers, consisting, in this order from the surface of the substrate 90, of TiW 93, of copper 94, of electrolytic copper 95, optionally electrolytic tin (not shown), their elaboration method being comparable with those already described for the metal bead of the first substrate;
- an anti-reflective layer 91 comprising for example an alternation of germanium and zinc sulfide layers;
- a layer or a set of layers 97 having properties for trapping gas molecules (getter effect) provided for opposing the degassing of the surfaces internal to the hermetically sealed cavity 96 comprised between both substrates after their sealing. Materials such as titanium or zirconium, deposited by evaporation or cathodic sputtering are preferred. The extent and the location of the getter material 97 are defined by conventional means such as deposition by lift-off, photolithography or deposition through a mechanical mask.

The first face of the substrate 90 furthermore includes recesses, in some of which are formed the elements 91, 97. The metal cords 98 are as for them formed on areas of the second substrate 90 located outside the recesses. A second anti-reflective layer 92 or optionally a more selective optical filter is further provided on the second face of the substrate 90.

A second substrate 90 ready to be sealed with a first substrate 10 and provided in such a way that the metal beads 98 and 88 are facing each other, the anti-reflective treatment 91 with the membrane suspended of the heat detectors 57, 67, a recess 99 facing the second electric contacts 41 are thereby available. The recess 99 is provided in order to be able to cut out with a saw the area of the substrate 90 facing the second electric contacts 41, without damaging them (step not shown).

The operation for sealing the substrates 10 and 90 then consists of aligning both substrates so as to put their sealing bead 88 and 98 in contact with each other, and then of heating the assembly in order to reach a temperature above the melting temperature of tin. The result of this is inter-diffusion of the tin into the copper and the forming of a copper-tin intermetallic alloy which solidifies with a melting point substantially higher than the temperature used for the sealing. Advantageously, the sealing operation is carried out in a vacuum chamber so as to hermetically seal in vacuo the heat detectors 57, 67 in hermetically sealed cavities 96.

The invention claimed is:

1. An infrared detection device comprising:
   an electronic readout circuit made on and/or in a first semiconducting substrate;
   a plurality of levels of electrical interconnections arranged on the first semiconductor substrate, comprising a penultimate level of electrical interconnections and a last level of interconnections provided on the penultimate level f electrical interconnections such that penultimate level of electrical interconnections is arranged between the electronic readout circuit and a last level of electrical interconnections;
   an etching stop layer arranged between the penultimate level of electrical interconnections and last level of electrical interconnections, the etching stop layer capable of withstanding etching of a first inter-metal dielectric layer arranged between the etching stop layer and the last level of electrical interconnections;
   an infrared heat detector electrically connected to the electronic readout circuit by at least one first electrically conducting via of the last level of electrical interconnections which crosses the etching stop layer;
   a connection pad formed by the last level of electrical interconnections, electrically connected to the electronic readout circuit by at least one second electrically conducting via of the last level of electrical interconnections which crosses the etching stop layer, and able to be electrically contacted from the outside of the infrared detection device;
   wherein the infrared heat detector and the connection pad are each spaced apart from the etching stop layer by a non-zero distance substantially equal relatively to each other, wherein the first and second electrically conducting vias are respectively electrically connected to first and second portions of a metal line of a penultimate level of electrical interconnections, and wherein an empty space formed in the first inter-metal dielectric layer surrounds the first electrically conducting via and extends under the infrared heat detector.

2. The infrared detection device according to claim 1, wherein the electronic readout circuit includes a plurality of electronic devices of the MOS type made on and/or in the first semiconducting substrate, wherein the penultimate level of electrical interconnections includes third electrically conducting vias made in a second inter-metal dielectric layer and electrically connecting at least first portions of the metal line to the electronic devices of the MOS type, and wherein the etching stop layer is arranged on the second inter-me dielectric layer.

3. The infrared detection device according to claim 2, wherein the metal line, the third electrically conducting vias, and the first electrically conducting via comprise the same material which is a metal.

4. The infrared detection device according to claim 1, wherein at least one third portion of the metal line is arranged facing the infrared heat detector and is able to reflect at least one part of infrared radiation intended to be detected by the infrared heat detector.

5. The infrared detection device according to claim 4, wherein the third portion of the metal line is not covered by the etching stop layer.

6. The infrared detection device according to claim 1, wherein the infrared heat detector includes a metal-insulator-metal stack able to absorb infrared radiation intended to be detected by the infrared heat detector, and at least one portion of material the resistivity of which varies according to temperature, thermally coupled with the metal-insulator-metal stack and electrically connected to the first electrically conducting via.

7. The infrared detection device according to claim 1, wherein the infrared heat detector includes a plurality of resistive portions able to absorb infrared radiation intended to be detected by the infrared heat detector, and a plurality of material portions the resistivity of which varies according to temperature, at least one of said material portions the resistivity of which varies according to temperature being electrically connected to the first electrically conducting via.

8. The infrared detection device according to claim 1, further including at least one first electric contact arranged on the first electrically conducting via, the infrared heat detector being electrically connected to the first electrically conducting via, via said electric contact.

9. The infrared detection device according to claim 1, wherein the infrared heat detector is encapsulated in a cavity delimited by at least one encapsulation layer comprising a material transparent to infrared radiation intended to be detected by the infrared heat detector, and by the etching stop layer.

10. The infrared detection device according to claim 1, wherein the infrared heat detector is encapsulated in a cavity delimited by at least one second substrate, the etching stop layer and a metal bead securing the second substrate to the etching stop layer, the second substrate comprising at least one material transparent to infrared radiation intended to be detected by the infrared heat detector.

11. The infrared detection device according to claim 1, including a plurality of infrared heat detectors forming an array of pixels of the infrared detection device, each infrared heat detector being electrically connected to the electronic readout circuit through at least one first electrically conducting via.

12. A method for making an infrared detection device, including at least the implementation of steps for:
making a plurality of levels of electrical interconnections on an electronic readout circuit which made on and/or in a first semiconducting substrate and including a last level of electrical interconnections provided on a penultimate level of electrical interconnections;
depositing an etching stop layer on the penultimate level of electrical interconnections;
depositing a first inter-metal dielectric layer on the etching stop layer, the first inter-metal dielectric layer comprising at least one mineral material able to be selectively etched relatively to the etching stop layer;
making on the first inter-metal dielectric layer, a last level of electrical interconnections forming at least one connection pad electrically connected to the electronic readout circuit through at least one second electrically conducting via of the last level of electrical interconnections which crosses the first inter-metal dielectric layer and the etching stop layer, the connection pad being able to be electrically contacted from the outside of the infrared detection device, and at least one infrared heat detector electrically connected to the electronic readout circuit through at least one first electrically conducting via of the last level of electrical interconnections which crosses the first inter-metal dielectric layer and the etching stop layer, the first and the second electrically conducting vias being respectively electrically connected to first and second portions of a metal line of the penultimate level of electrical interconnection, and wherein the infrared heat detector and the connection pad are each spaced apart from the etching stop layer by a non-zero distance substantially equal relatively to each other;
etching at least one portion of the first inter-metal dielectric layer arranged between the electronic readout circuit and the infrared heat detector, forming an empty space surrounding the first electrically conducting via and extending under the infrared heat detector.

13. The method according to claim 12 wherein the electronic readout circuit includes a plurality of electronic devices of the MOS type made on and/or in the first semiconducting substrate, and wherein the penultimate level of electrical interconnections includes third electrically conducting vias made in a second inter-metal dielectric layer and electrically connecting at least first portions of the metal line to the electronic devices of the MOS type, and wherein the etching stop layer is deposited on the second inter-metal dielectric layer.

14. The method according to claim 13, wherein the metal line, the third electrically conducting vias, and the first electrically conducting via comprise the same material which is a metal, and wherein the second inter-metal dielectric layer comprise a mineral material similar to the mineral material of the first inter-metal dielectric layer.

15. The method according to claim 12, wherein at least one third portion of the metal line is arranged facing the infrared heat detector and is able to reflect at least one part of infrared radiation intended to be detected by the infrared heat detector.

16. The method according to claim 15, further including, between the step for depositing the etching stop layer and the step for depositing the first inter-metal dielectric layer, a step for etching a portion of the etching stop layer which covers the third portion of the metal line.

17. The method according to claim 12, wherein the making of the infrared heat detector includes the making of a metal-insulator-metal stack able to absorb infrared radiation intended to be detected by the infrared heat detector, and the making of at least one material portion the resistivity of which varies according to temperature, thermally coupled with the metal-insulator-metal stack and electrically connected to the first electrically conducting via.

18. The method according to claim , wherein the making of the infrared heat detector includes the making of a plurality of resistive portions able to absorb infrared radiation intended to be detected by the infrared heat detector, and the making of a plurality of material portions for which the resistivity varies according to temperature, at least one of said material portions for which the resistivity varies according to temperature, being electrically connected to the first electrically conducting via.

19. The method according to claim 12, further including, between the step for depositing the first inter-metal dielectric layer and the step for making the infrared heat detector, the making of at least one first electric contact on the first electrically conducting via, the infrared heat detector being electrically connected to the first electrically conducting via, via said electric contact.

20. The method according to claim 12, further including between the step for making the infrared heat detector and the step for etching at least one portion of the first inter-metal dielectric layer, the implementation of steps for:
depositing a sacrificial layer covering at least the infrared heat detector, the sacrificial layer comprising at least one mineral material able to be selectively etched relatively to the etching stop layer;
etching at least one trench through at least the first inter-metal dielectric layer and the sacrificial layer and delimiting the at least one portion of the first inter-metal dielectric layer and at least one portion of the sacrificial layer;
depositing in said trench and on the at least one portion of the sacrificial layer, at least one encapsulation layer comprising a material transparent to infrared radiation intended to be detected by the infrared heat detector;
making at least one aperture through the encapsulation layer;
wherein the step for etching at least one portion of the first inter-metal dielectric layer is carried out via the aperture and removes the at least one portion of the first inter-metal dielectric layer and the at least one portion of the sacrificial layer such that the infrared heat detector is encapsulated in a cavity delimited by at least the encapsulation layer and the etching stop layer,
and further including after said etching step, the implementation of a step for plugging the aperture.

21. The method according to claim 12, further including, between the step for making the infrared heat detector and the step for etching at least one part of the first inter-metal dielectric layer, the implementation of a step for making at least one metal bead on the etching stop layer, through at least the first inter-metal dielectric layer and further including, after the step for etching at least one part of the first inter-metal dielectric layer, the securing of at least one second substrate to the metal bead such that the infrared heat detector is encapsulated in a cavity delimited by at least the second substrate, the etching stop layer and the metal bead, the second substrate comprising at least one material transparent to infrared radiation intended to be detected by the infrared heat detector.

22. The method according to claim 12, including the making of a plurality of infrared heat detectors forming an array of pixels of the infrared detection device, each infrared heat detector being electrically connected to the electronic readout circuit through at least one first electrically conducting via.

* * * * *